United States Patent
Momiuchi et al.

(10) Patent No.: US 10,917,550 B2
(45) Date of Patent: Feb. 9, 2021

(54) ELECTRONIC COMPONENT, CAMERA MODULE, AND METHOD FOR MANUFACTURING ELECTRONIC COMPONENT

(71) Applicant: SONY SEMICONDUCTOR SOLUTIONS CORPORATION, Kanagawa (JP)

(72) Inventors: Yuta Momiuchi, Kanagawa (JP); Ryo Itotani, Kanagawa (JP); Hirokazu Nakayama, Kanagawa (JP); Tooru Kai, Oita (JP); Miyoshi Togawa, Oita (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/471,914

(22) PCT Filed: Dec. 28, 2017

(86) PCT No.: PCT/JP2017/047355
§ 371 (c)(1),
(2) Date: Jun. 20, 2019

(87) PCT Pub. No.: WO2018/142834
PCT Pub. Date: Aug. 9, 2018

(65) Prior Publication Data
US 2019/0387145 A1  Dec. 19, 2019

(30) Foreign Application Priority Data
Jan. 31, 2017  (JP) ................. 2017-015841

(51) Int. Cl.
*H04N 5/225* (2006.01)

(52) U.S. Cl.
CPC .......... *H04N 5/2257* (2013.01); *H04N 5/2253* (2013.01); *H04N 5/2254* (2013.01); *H04N 5/22521* (2018.08)

(58) Field of Classification Search
CPC ............. H04N 5/2257; H04N 5/22521; H04N 5/2253; H04N 5/2254; H04N 5/335; H04N 5/359; H05K 1/18; G03B 17/02
See application file for complete search history.

(56) References Cited

U.S. PATENT DOCUMENTS 6,075,237 A * 6/2000 Ciccarelli ........... H01L 31/0203
250/208.1
2001/0050721 A1 12/2001 Miyake
(Continued)

FOREIGN PATENT DOCUMENTS

| CN | 1330487 A | 1/2002 |
|----|-----------|--------|
| CN | 101166236 A | 4/2008 |

(Continued)

OTHER PUBLICATIONS

Loctite, LOCTITE ABLESTICK NCA 2280 Technical Data Sheer, Jul. 2014 (Year: 2014).*
(Continued)

*Primary Examiner* — Timothy J Henn
(74) *Attorney, Agent, or Firm* — Chip Law Group

(57) ABSTRACT

To enable a structure to be downsized, and to restrict a reduction in image quality. There is provided an electronic component including a circuit board having a first face, a second face opposite to the first face, and a first opening, a translucent member provide to oppose the first face of the circuit board, an imaging device flip-chip mounted on the second face of the circuit board and having a light receiving face on a side opposing the translucent member, and a light absorption member provided between the circuit board and the translucent member and formed in a region other than the
(Continued)

1A first opening in plan view on the first face of the circuit board.

18 Claims, 25 Drawing Sheets

(56) References Cited

U.S. PATENT DOCUMENTS

| | | | |
|---|---|---|---|
| 2002/0105002 A1* | 8/2002 | Ono | H01L 33/483 257/81 |
| 2005/0104991 A1 | 5/2005 | Hoshino et al. | |
| 2006/0016973 A1* | 1/2006 | Yang | H01L 31/02325 250/239 |
| 2006/0108656 A1* | 5/2006 | Minamio | H01L 31/0203 257/433 |
| 2012/0211852 A1* | 8/2012 | Iwafuchi | H01L 27/1462 257/435 |
| 2013/0127004 A1* | 5/2013 | Ru | H01L 27/14618 257/443 |
| 2014/0063307 A1* | 3/2014 | Wang | H04N 5/2254 348/302 |
| 2014/0168510 A1* | 6/2014 | Hamada | H05K 3/30 348/374 |
| 2015/0256725 A1* | 9/2015 | Jiang | H04N 5/2253 348/373 |
| 2017/0023775 A1* | 1/2017 | Shigemitsu | G02B 13/0025 |
| 2019/0141224 A1* | 5/2019 | Park | H01L 27/14625 |
| 2019/0258019 A1* | 8/2019 | Ohara | H01L 27/14625 |

FOREIGN PATENT DOCUMENTS

| | | |
|---|---|---|
| EP | 1081944 A2 | 3/2001 |
| EP | 1148716 A1 | 10/2001 |
| JP | 2001-128072 A | 5/2001 |
| JP | 2001-292354 A | 10/2001 |
| JP | 2001-345391 A | 12/2001 |
| JP | 2008-103957 A | 5/2008 |
| JP | 2014-216973 A | 11/2014 |
| KR | 10-2001-0091053 A | 10/2001 |
| NO | 20011727 L | 10/2001 |

OTHER PUBLICATIONS

International Search Report and Written Opinion of PCT Application No. PCT/JP2017/047355, dated Mar. 13, 2018, 09 pages of ISRWO.

* cited by examiner

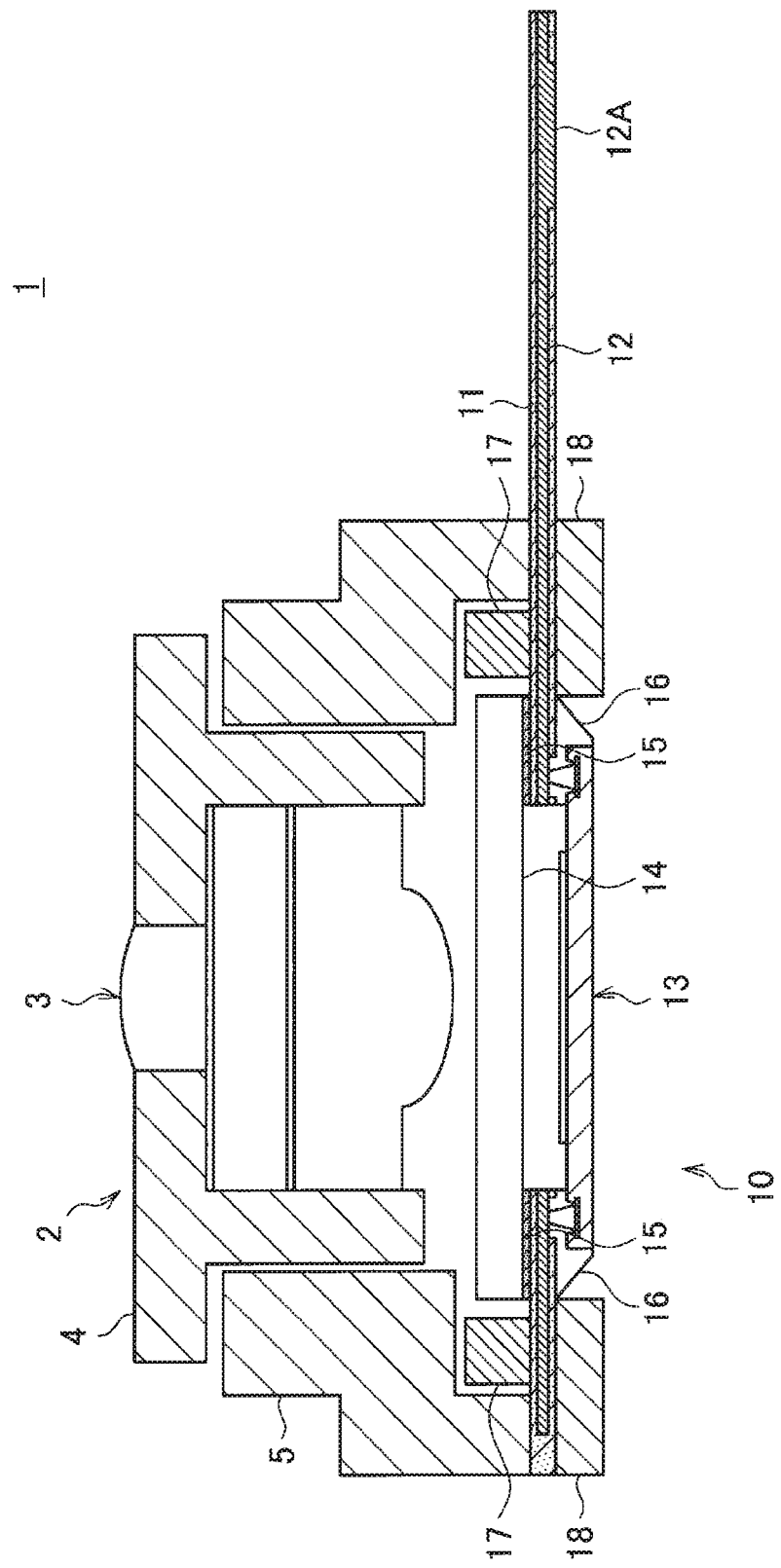

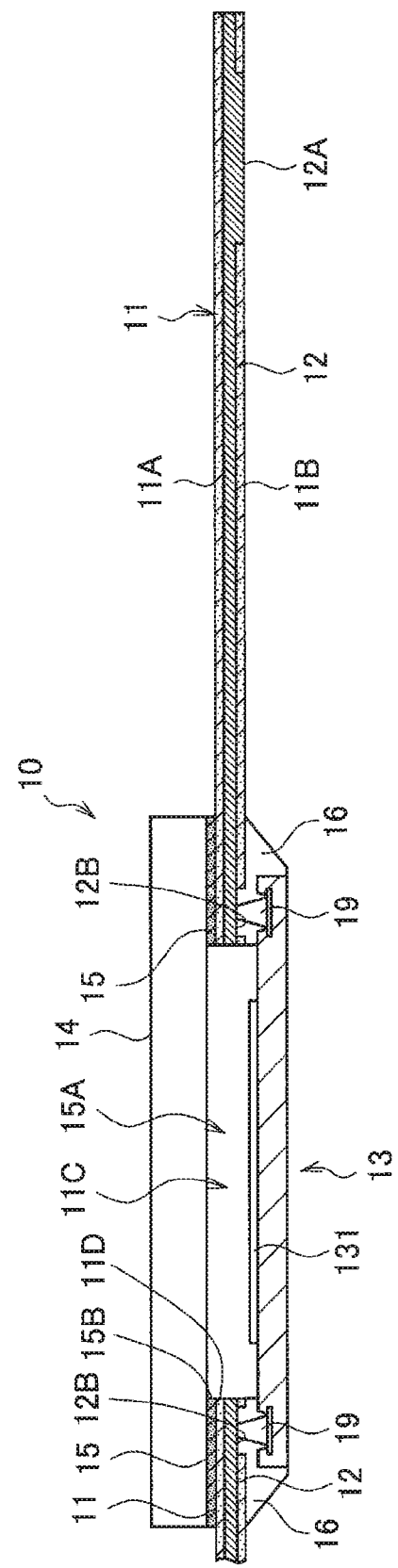

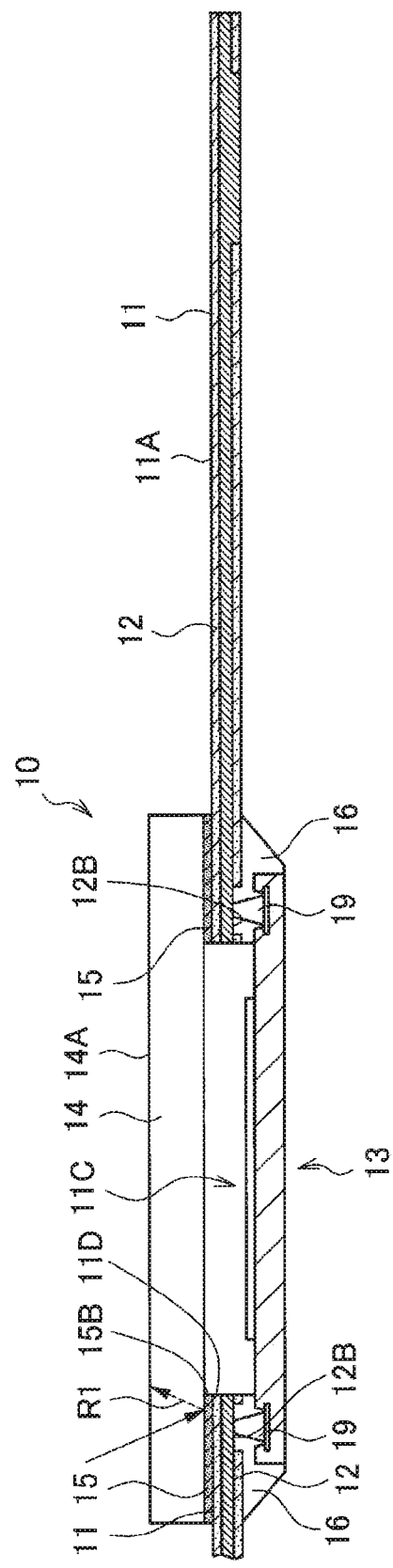

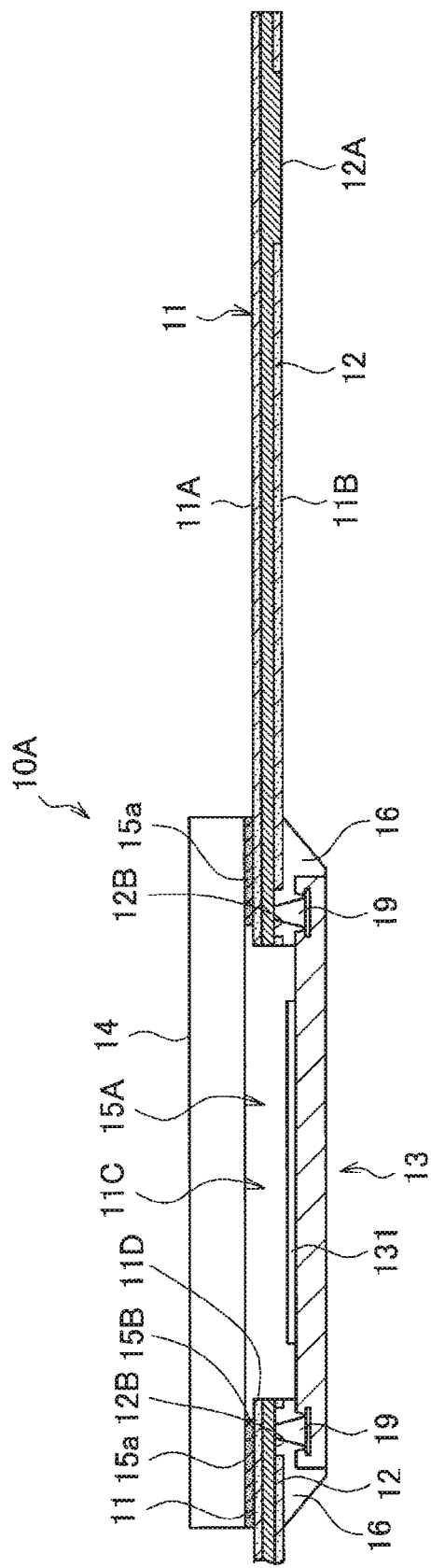

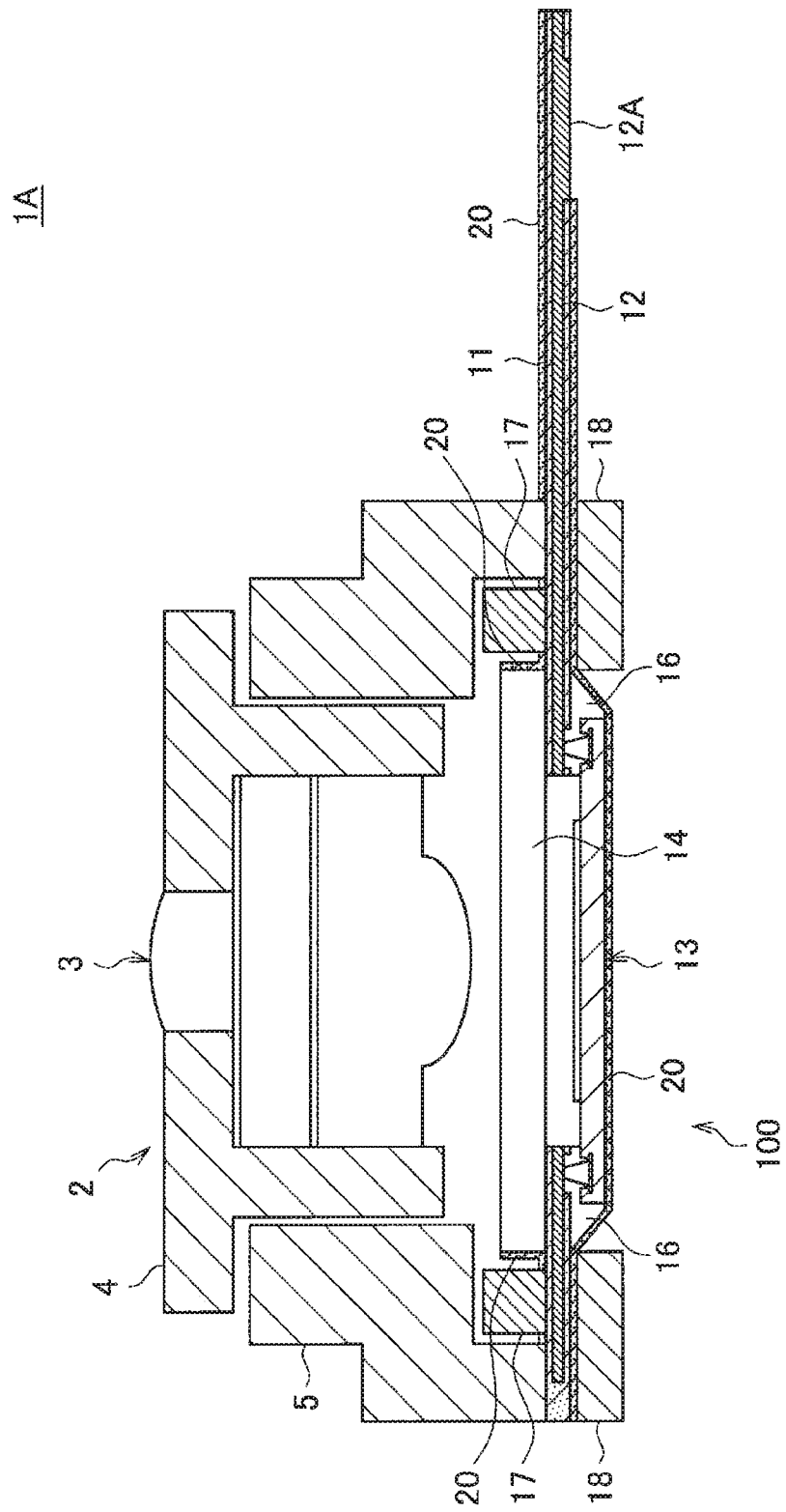

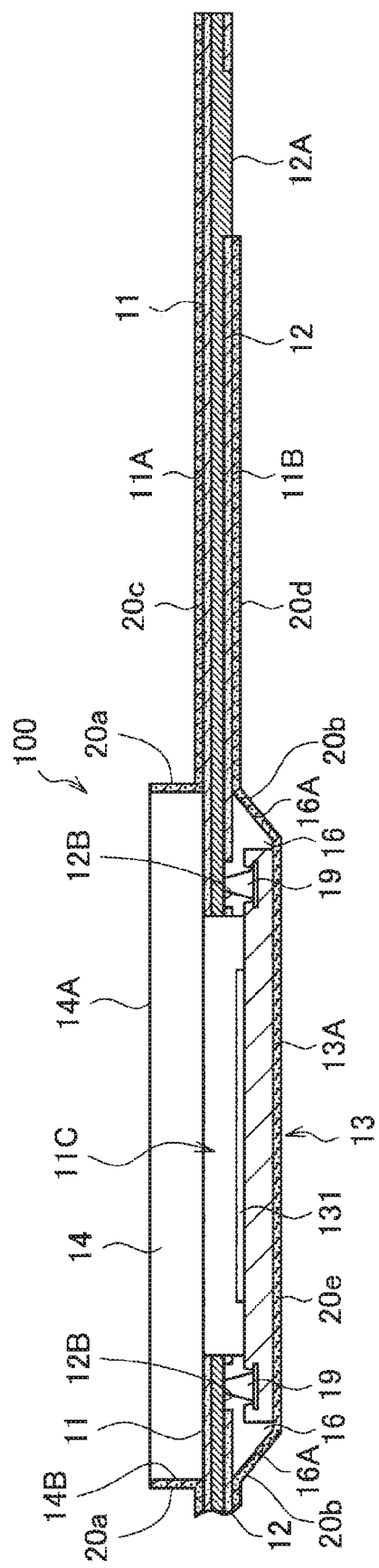

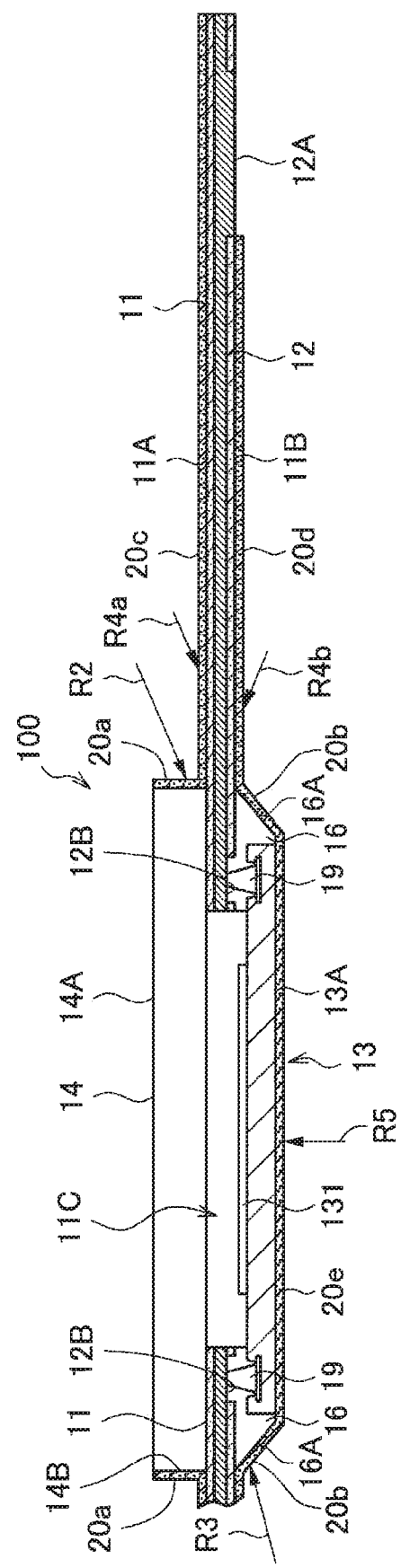

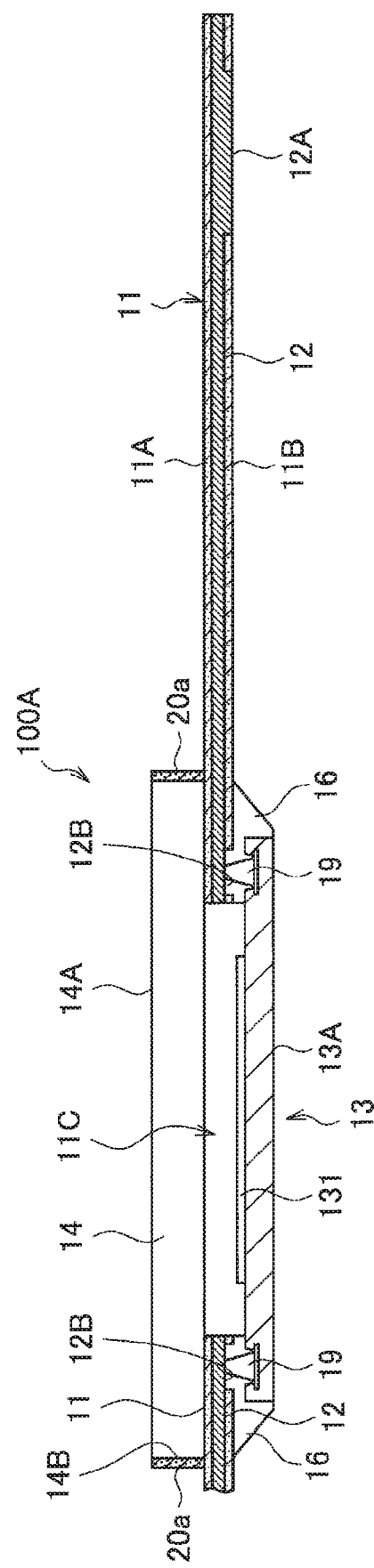

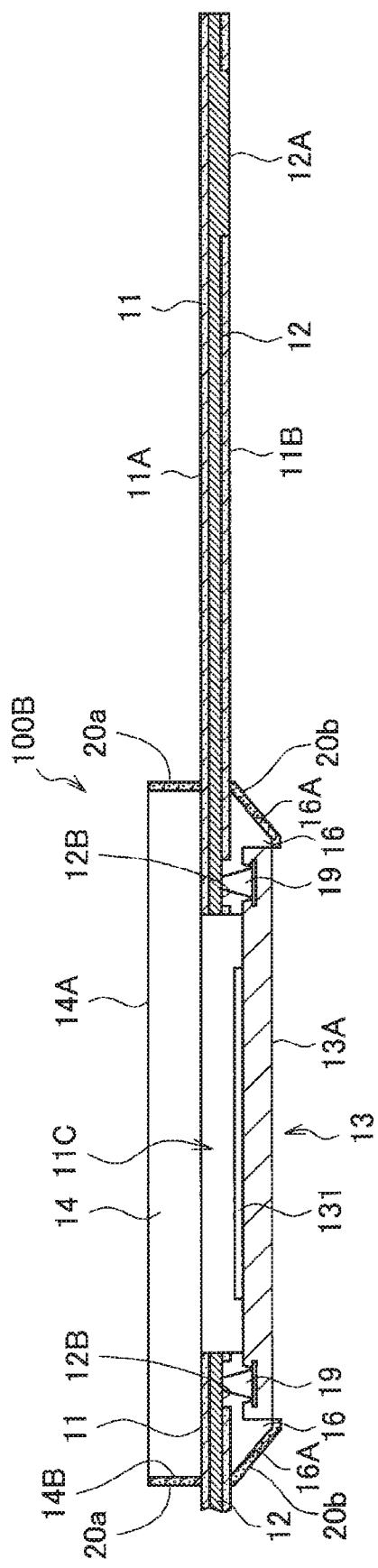

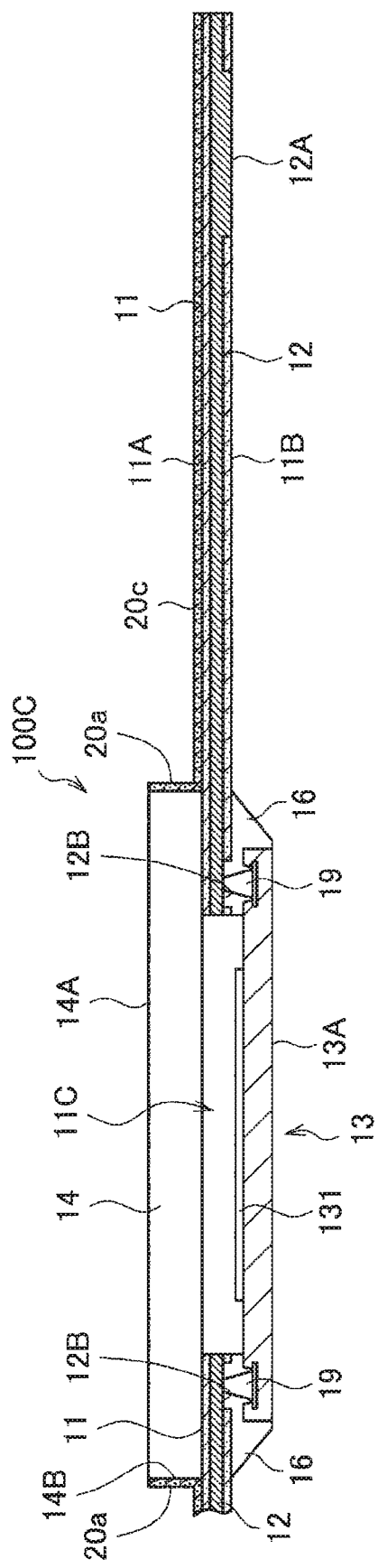

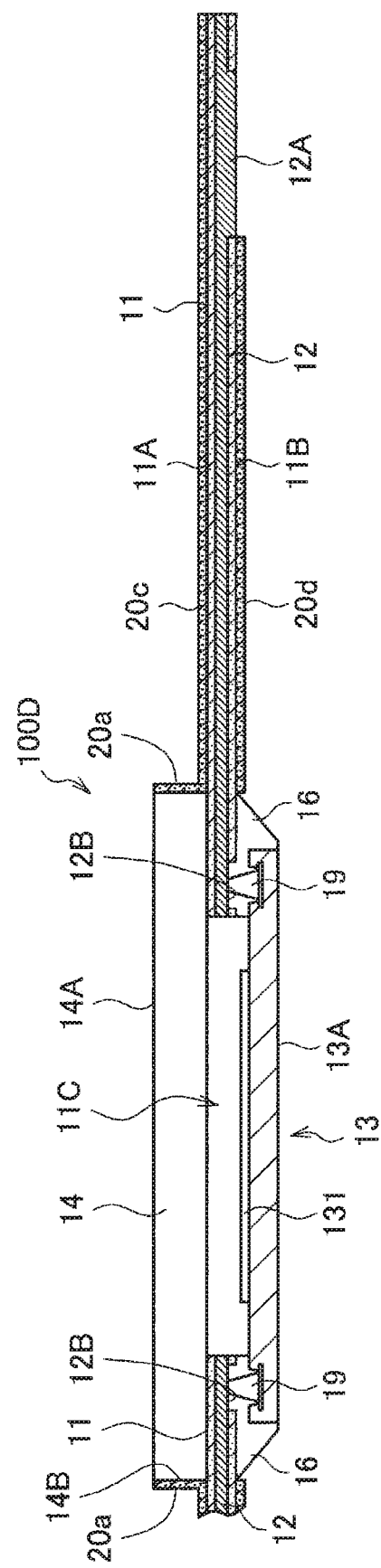

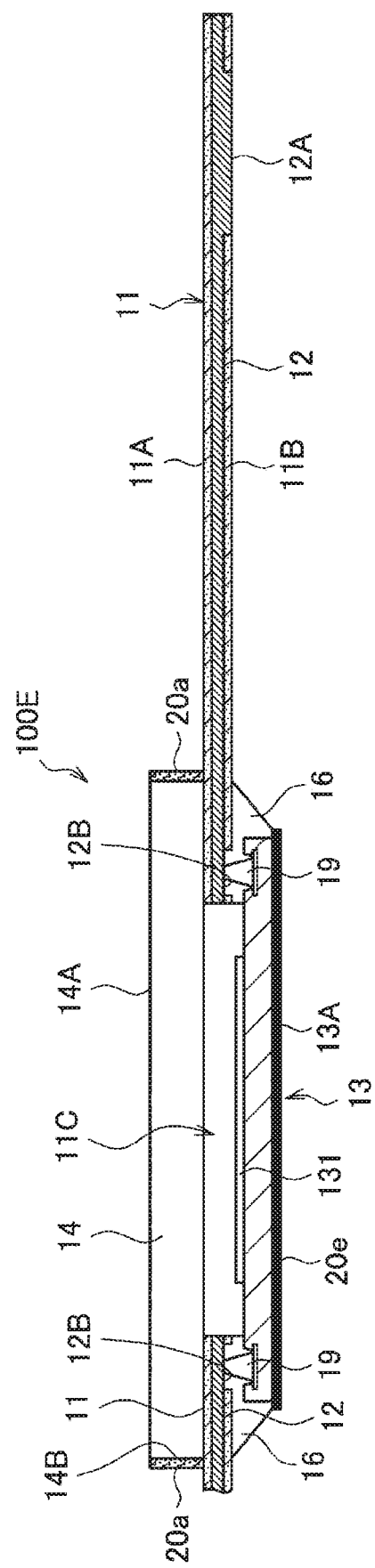

ELECTRONIC COMPONENT, CAMERA MODULE, AND METHOD FOR MANUFACTURING ELECTRONIC COMPONENT

CROSS REFERENCE TO RELATED APPLICATIONS

This application is a U.S. National Phase of International Patent Application No. PCT/JP2017/047355 filed on Dec. 28, 2017, which claims priority benefit of Japanese Patent Application No. JP 2017-015841 filed in the Japan Patent Office on Jan. 31, 2017. Each of the above-referenced applications is hereby incorporated herein by reference in its entirety.

TECHNICAL FIELD

The present disclosure relates to an electronic component, a camera module, and a method for manufacturing the electronic component.

BACKGROUND ART

In recent years, an advanced process such as flip-chip mounting has been introduced into image sensors mounted on camera modules realizing a shooting function in various shooting apparatuses similarly to other semiconductor chips, and chip shrink has increasingly advanced. In a case where such downsizing is advanced, for example, light applied from an unintentional part, such as reflected light from wiring or the like on a board, enters a light receiving face, and thus flare or ghost can occur. Consequently, a reduction in image quality can be caused.

Patent Document 1 described below discloses, as a measure to restrict such reduction in image quality, a technology for flip-chip mounted electronic components which have a light shielding member for restricting photocurable resin from flowing while restricting a failure due to reflected light in beam lead, for example.

CITATION LIST

Patent Document

Patent Document 1: Japanese Patent Application Laid-Open No. 2001-345391

However, a light transmission region relative to an effective pixel region on the light receiving face needs to be minimized in order to advance further downsizing of the camera modules. In this case, the effective pixel region can be needlessly narrowed in the light shielding member disclosed in Patent Document 1 described above. Further, the light shielding member disclosed in Patent Document 1 described above is formed on a glass face as a translucent protective member. In this case, the effective pixel region can vary per product depending on positioning accuracy in bonding the image sensor and the protective member. Therefore, a reduction in image quality can be caused.

Therefore, the present disclosure proposes a novel and improved electronic component capable of downsizing a structure and restricting a reduction in image quality, a camera module, and a method for manufacturing the electronic component.

Solutions to Problems

According to the present disclosure, there is provided an electronic component including a circuit board having a first face, a second face opposite to the first face, and a first opening, a translucent member provide to oppose the first face of the circuit board, an imaging device flip-chip mounted on the second face of the circuit board and having a light receiving face on a side opposing the translucent member, and alight absorption member provided between the circuit board and the translucent member and formed in a region other than the first opening in plan view on the first face of the circuit board.

Further, according to the present disclosure, there is provided an electronic component including a circuit board having a first face, a second face opposite to the first face, and an opening, a translucent member provided to oppose the first face of the circuit board and having an outer peripheral end face, an imaging device flip-chip mounted on the second face of the circuit board and having a light receiving face on a side opposing the translucent member, and a light shielding member formed at least on the outer peripheral end face of the translucent member.

Further, according to the present disclosure, there is provided a camera module including a circuit board having a first face, a second face opposite to the first face, and an opening, a translucent member provided to oppose the first face of the circuit board, a lens unit provided opposite to a side of the translucent member opposing the circuit board, an imaging device flip-chip mounted on the second face of the circuit board and having a light receiving face on a side opposing the translucent member, and alight absorption member provided between the circuit board and the translucent member and formed in a region other than the first opening in plan view on the first face of the circuit board.

Further, according to the present disclosure, there is provided a camera module including a circuit board having a first face, a second face opposite to the first face, and an opening, a translucent member provided to oppose the first face of the circuit board and having an outer peripheral end face, a lens unit provided opposite to a side of the translucent member opposing the circuit board, an imaging device flip-chip mounted on the second face of the circuit board and having a light receiving face on a side opposing the translucent member, and a light shielding member formed at least on the outer peripheral end face of the translucent member.

Further, according to the present disclosure, there is provided a method for manufacturing an electronic component including forming a light absorption member on a first face of a circuit board having the first face and a second face opposite to the first face, forming an opening at a predetermined position on the circuit board with the light absorption member formed, flip-chip mounting an imaging device having a light receiving face on the second face of the circuit board while the light receiving face opposes the opening of the circuit board, and providing a translucent member to oppose the first face of the circuit board and to sandwich the light absorption member between the translucent member and the circuit board.

Further, according to the present disclosure, there is provided a method for manufacturing an electronic component including forming a light absorption member in a region other than in an opening on a first face of a circuit board having the first face, a second face opposite to the first face, and the opening in plan view, flip-chip mounting an imaging device having a light receiving face on the second face of the circuit board while the light receiving face opposes the opening of the circuit board, and providing a translucent member to oppose the first face of the circuit board and to sandwich the light absorption member between the translucent member and the circuit board.

Effects of the Invention

As described above, according to the present disclosure, it is possible to downsize a structure and to restrict a reduction in image quality.

Additionally, the above effect is not necessarily restrictive, and any effect described in the present specification or other effect graspable from the present specification may be obtained together with the above effect or instead of the above effect.

BRIEF DESCRIPTION OF DRAWINGS

FIG. 1 is a cross-section view illustrating a schematic configuration of a camera module according to a first embodiment of the present disclosure.

FIG. 2 is a cross-section view illustrating an exemplary configuration of an electronic component according to the embodiment.

FIG. 3 is a diagram for explaining operations and effects of the electronic component according to the embodiment.

FIG. 4 is a cross-section view illustrating an exemplary configuration of an electronic component according to a variant of the embodiment.

FIG. 8 is a cross-section view illustrating a schematic configuration of a camera module according to a second embodiment of the present disclosure.

FIG. 9 is a cross-section view illustrating an exemplary configuration of an electronic component according to the embodiment.

FIG. 10 is a diagram for explaining operations and effects of the electronic component according to the embodiment.

FIG. 11 is a cross-section view illustrating an exemplary configuration of an electronic component according to a first variant of the embodiment.

FIG. 12 is a cross-section view illustrating an exemplary continuation of an electronic component according to a second variant of the embodiment.

FIG. 13 is a cross-section view illustrating an exemplary configuration of an electronic component according to a third variant of the embodiment.

FIG. 14 is a cross-section view illustrating an exemplary configuration of an electronic component according to a fourth variant of the embodiment.

FIG. 15 is a cross-section view illustrating an exemplary configuration of an electronic component according to a fifth variant of the embodiment.

MODE FOR CARRYING OUT THE INVENTION

Figure 5A:
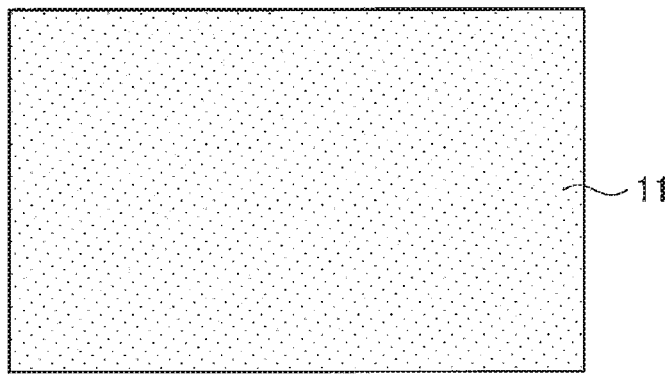
FIG. 5A is a schematic diagram illustrating an exemplary step in a method for forming a light absorption member according to the embodiment.

Preferred embodiments of the present disclosure will be described below in detail with reference to the accompanying drawings. Additionally, the constituents having substantially the same functional configuration are denoted with the same reference numeral and a repeated description thereof will be omitted in the present specification and the drawings.

Further, the elements having substantially the same functional configuration may be discriminated by different alphabets after the same reference numeral in the present specification and the drawings. However, in a case where a plurality of elements having substantially the same functional configuration does not need to be particularly discriminated, only the same reference numeral is denoted.

Additionally, the description will be made in the following order.

1. Outline
2. First Embodiment
  2.1. Schematic configuration of camera module
  2.2. Configuration of electronic component
  2.3. Operations and effects
  2.4. Variants
  2.5. Method for manufacturing electronic component
3. Second Embodiment
  3.1. Schematic configuration of camera module
  3.2. Configuration of electronic component
  3.3. Operations and effects
  3.4. Variant 4. Third Embodiment
5. Application to in-vivo information acquisition system
6. Application to endoscopic surgery system
7. Application to moving object
8. Conclusion

1. OUTLINE

An electronic component according to a related technology will be described prior to describing an electronic component mounted on a camera module according to one embodiment of the present disclosure. Additionally, an electronic component in the present disclosure means an electronic component in which an imaging device as image sensor is flip-chip mounted on a circuit board, but the imaging device is an exemplary chip.

Figure 23:
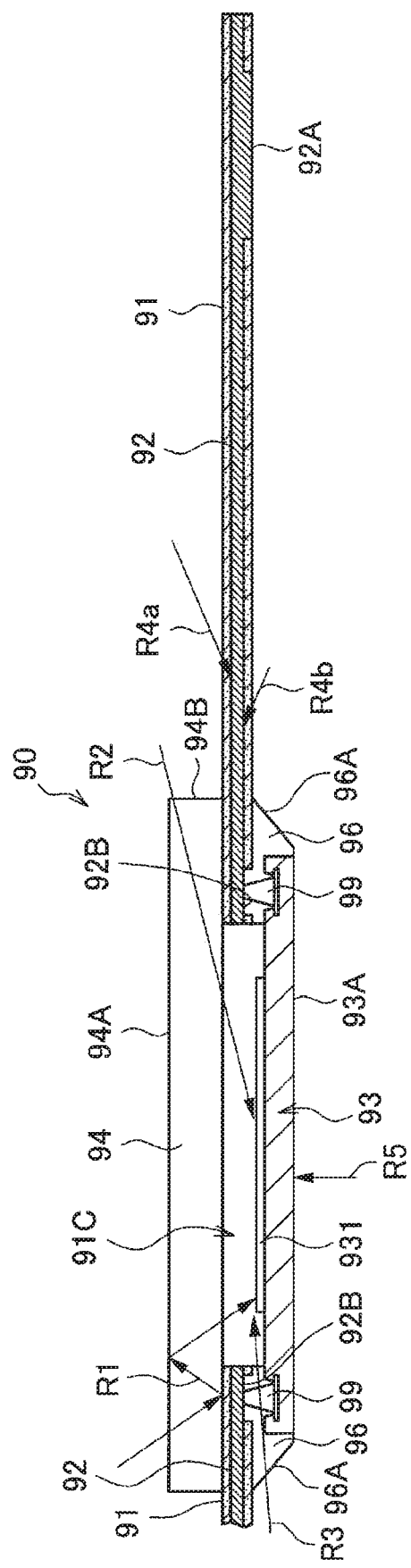
FIG. 23 is a cross-section view illustrating an exemplary configuration of an electronic component according to a related technology.

FIG. 23 is a cross-section view illustrating an exemplary configuration of an electronic component 90 according to a related technology. As illustrated in FIG. 23, the electronic component 90 according to the related technology includes a circuit board 91 having wiring 92, an imaging device 93, and a translucent member 94.

The circuit board 91 is made of a base material such as polyimide, for example. The wiring 92 is provided on one side or both sides of the circuit board 91, and configures an electronic circuit. Further, the wiring 92 is provided as external terminals 92A and pads 92B to be exposed on the circuit board 91 at part of a face (lower face 91B) of the circuit board 91 on the side of the imaging device 93. The imaging device 93 is flip-chip mounted on the circuit board 91 via bumps 99 formed at terminals of the imaging device 93, and is electrically connected to the circuit board 91 via the pads 92B. The imaging device 93 includes a light receiving face 931, and the light receiving face 931 opposes the translucent member 94. Further, the circuit board 91 and the imaging device 93 are fixed by encapsulation resin 96 filled therebetween. A space between the circuit board 91 and the imaging device 93 is sealed by the encapsulation resin 96. Additionally, the circuit board 91 and the translucent member 94 can be adhered to each other by adhesive resin or the like (not illustrated).

However reflected light or stray light may enter the light receiving face 931 of the imaging device 93 in the electronic component 90 illustrated in FIG. 23. For example, as illustrated in FIG. 23, light R1 capable of emitting from a lens of a camera module can enter the translucent member 94, then reflect on a face (upper face 91A) of the circuit board 91 on the side of the translucent member 94, then reflect on an upper face 94A of the translucent member 94 again, and enter the light receiving face 931 as reflected light.

Further, stray light may invade the light receiving face 931 from the outside below the camera module 1 illustrated in FIG. 23. For example, stray light R2 can invade from an outer peripheral end face 94B of the translucent member 94 and enter the inside of the electronic component 90. Further, light R3 can invade from an outer surface 96A of the encapsulation resin 96 and enter the inside of the electronic component 90. Further, in a case where the circuit board 91 is a flexible board made of polyimide or the like, stray light R4a and R4b can invade from the upper face 91A or the lower face 91B of the circuit board 91, pass inside the circuit board 91, and enter the inside of the electronic component 90. Further, in a case where the imaging device 93 is thin, light R5 may transmit through the imaging device 93 from a backside face 93A of the imaging device 93 and enter the light receiving face 931.

Reflected light such as the light R1 or stray light such as the light R2 to the light R5 is more likely to enter the light receiving face of the imaging device along with a reduction in size of the camera module or the electronic component. Thus, there is assumed a configuration with the light shielding member disclosed in Japanese Patent Application Laid-Open No. 2001-345391, for example. However, the opening peripheral end face of the light shielding member disclosed in Patent Document 1 is provided closer to the center than the opening peripheral end face of the circuit board, and thus the effective pixel region can be narrowed. Further, the light shielding member is formed on a glass face as protective member, and thus the effective pixel region can vary per product depending on positioning accuracy in bonding the protective member and the imaging device. Thus, it is difficult to achieve further downsizing of the camera module or the electronic component, and to restrict a reduction in image quality.

Thus, at least any of a light absorption member or a light shielding member is provided in an electronic component according to one embodiment of the present disclosure, thereby preventing reflected light or stray light from invading the light receiving face. With the configuration, an occurrence of flare or ghost is restricted and a variation in the effective pixel region in the manufacture phase is restricted. Therefore, it is possible to restrict a reduction in image quality and to realize further downsizing.

An electronic component according to each embodiment of the present disclosure will be described below.

2. FIRST EMBODIMENT

A first embodiment of the present disclosure will be first described.

<2.1. Schematic Configuration of Camera Module>

FIG. 1 is a cross-section view illustrating a schematic configuration of a camera module 1 according to the first embodiment of the present disclosure. As illustrated in FIG. 1, the camera module 1 includes a lens unit 2, an electronic component 10, and a reinforcement plate 18. Additionally, the camera module 1 according to the present embodiment can be mounted on any apparatus having a shooting function, such as digital camera, Smartphone, cell phone, tablet, notebook-type personal computer (PC), home electronics, industrial devices, laboratory devices, or transport machinery, for example.

As illustrated in FIG. 1, the lens unit 2 includes a group of lenses 3, a holder 4 for fixing and supporting the group of lenses 3, and a housing 5 for supporting the holder 4 to be vertically movable. The above-described lens unit 2 is realized by a well-known lens unit. The lens unit 2 to be employed can be determined as needed depending on the specification of the imaging device 13 or the design items of the electronic component 10.

As illustrated in FIG. 1, the electronic component 10 includes a circuit board 11 having wiring 12, the imaging device 13, a translucent member 14, a light absorption member 15, encapsulation resin 16, and a passive component 17. A detailed configuration of the electronic component 10 except the passive component 17, and the functions of the respective constituents will be described below. The passive component 17 is a passive device realized by a chip capacitor, a capacitor, or the like. The passive component 17 to be employed is determined as needed depending on the design items of the electronic component Further, the reinforcement plate 18 can be provided for supporting the lens unit 2 and the electronic component 10.

In the example illustrated in FIG. 1, the reinforcement plate 18 can be provided below the lower face of the circuit board 11 and at the lower part of the housing 5 in order to prevent the circuit board 11 from bending due to the weight of the lens unit 2.

<2.2. Configuration of Electronic Component>

An exemplary configuration of the electronic component 10 according to the present embodiment will be described below. FIG. 2 is a cross-section view illustrating an exemplary configuration of the electronic component 10 according to the present embodiment. Additionally, the configuration of the passive component 17 is omitted from FIG. 2.

As illustrated in FIG. 2, the electronic component 10 includes the circuit board 11, the imaging device 13, the translucent member 14, the light absorption member 15, the encapsulation resin 16, and bumps 19.

The circuit board 11 can be a flexible wiring board, a rigid flexible wiring board, or the like made of a base material such as polyimide, for example. The wiring 12 is provided on either face or both faces of the circuit board 11, and configures an electronic circuit. The wiring 12 is made of a metal such as copper, for example. The circuit board 11 may be a print circuit board in which the wiring 12 is printed on a lower face 11B (corresponding to a second face) opposite to an upper face 11A (corresponding to a first face) of the circuit board 11, for example. In this case, an insulative resist layer can be formed on the lower face 11B of the circuit board 11. At this time, an external terminal 12A capable of being electrically connected to other device may be formed on the lower face 11B of the circuit board 11.

Further, the circuit board 11 includes an opening 11C (corresponding to a first opening). Light collected by the group of lenses 3 in the lens unit 2 can pass through the opening 11C and enter a light receiving face 131 of the imaging device 13.

The imaging device 13 is an image sensor such as complementary metal oxide semiconductor (CMOS) image sensor, for example. The imaging device 13 has, for example, the light receiving face 131 in which unit pixels including photoelectric conversion devices (simply denoted as pixel below) are two-dimensionally arranged in a matrix shape, and senses the amount of charges depending on the amount of light incident into the light receiving face 131 as the physical amount in units of pixel.

The imaging device 13 is flip-chip mounted on the lower face 11B of the circuit board 11. Here, the imaging device 13 is electrically connected to the circuit board 11 via the bumps 19 formed at terminals of the imaging device 13.

The translucent member 14 is made of a translucent material such as glass or resin film, for example. The translucent member 14 may be an infrared ray cut filter (IRCF) made of glass, resin film, or the like having an infrared ray absorption function, for example, in order to restrict an occurrence of red color. Further, an IRCF as optical filter having an infrared ray absorption material may be adhered on the upper face or the lower face of the translucent member 14.

The translucent member 14 is provided to oppose the upper face 11A of the circuit board 11. It is preferable that the translucent member 14 be as large as it is positioned at least on the bumps 19 such that the bonding strength between pads 12B and the bumps 19 is kept at a certain level or more. Further, the mutually-opposed faces of the circuit board 11 and the translucent member 14 can be adhered by adhesive resin (not illustrated). Further, as described below, the translucent member 14 according to the present embodiment is provided to be bonded to the upper face of the light absorption member 15 formed on the upper face 11A of the circuit board 11.

The light absorption member 15 is a member having a light absorption characteristics, and is a member provided between the circuit board 11 and the translucent member 14 and formed on the upper face 11A of the circuit board 11. The light absorption member 15 is formed in a region other than the opening 11C in the upper face 11A of the circuit board 11. That is, the light absorption member 15 is formed so that it does not protrude above the opening 11C.

The light absorption member 15 according to the present embodiment is formed on the entire region opposite to the translucent member 14 and except the opening 11C on the upper face 11A of the circuit board 11. At this time, as illustrated in FIG. 2, the light absorption member 15 includes an opening 15A (corresponding to a second opening) corresponding to the opening 11C of the circuit board 11. The light absorption member 15 is then formed such that an opening peripheral end face 15B of the opening 15A of the light absorption member 15 is aligned with an opening peripheral end face 11D of the opening 11C of the circuit board 11.

The light absorption member 15 can be formed by applying resin or dye having the light absorption characteristics on the upper face 11A of the circuit board 11, for example. Further, the light absorption member 15 can be formed by printing an ink having the light absorption characteristics on the upper face 11A of the circuit board 11. Further, the light absorption member 15 can be formed as a light absorption film containing carbon or the like on the upper face 11A of the circuit board 11 by use of a film forming method such as sputtering.

A material making the light absorption member 15 may be a dye containing a black material, resin, film, or the like, for example. The black material herein may be a carbon material, for example. Additionally, the light absorption member 15 may be made of any material having the light absorption characteristics.

Further, the above-described resin may be a resist material, for example.

Further, the light absorption member 15 may have a function as an adhesive for adhering the mutually-opposed faces of the circuit board 11 and the translucent member 14 instead of adhesive resin (not illustrated). Thereby, a step of forming the light absorption member 15 on the upper face 11A of the circuit board 11 and a step of forming the adhesive resin on either opposed face of the circuit board 11 or the translucent member 14 can be put together.

The encapsulation resin 16 is thermosetting, photocurable, or photothermal curable resin, and is a member for sealing between the circuit board 11 and the imaging device 13. The encapsulation resin 16 is filled and hardened between the circuit board 11 and the imaging device 13 so that the circuit board 11 and the imaging device 13 are fixed. The encapsulation resin 16 is filled in the gap between the circuit board 11 and the imaging device 13, and then is irradiated by light such as ultraviolet rays or heated to be hardened.

<2.3. Operations and Effects>

FIG. 3 is a diagram for explaining operations and effects of the electronic component 10 according to the present embodiment. The cross-section view of the electronic component 10 illustrated in FIG. 3 is the same as the cross-section view illustrated in FIG. 2.

As illustrated in FIG. 3, most of light passing through an upper face 14A of the translucent member 14 and travelling toward the circuit board 11 is absorbed in the light absorption member 15, and thus reflected light R1 is less likely to reach the light receiving face 131. Thereby, a reduction in image quality due to flare, ghost, or the like caused by reflected light from the circuit board 11 can be restricted.

Further, the light absorption member 15 is formed on the upper face 11A of the circuit board 11, and thus a positional offset of the light absorption member 15 is less likely to occur when the circuit board 11 and the translucent member 14 are bonded. Thus, the positioning accuracy of the light absorption member 15 is increased, and thus the effective pixel region of the imaging device 13 is less likely to vary. Therefore, a reduction in image quality per product is less likely to occur.

Further, the light absorption member 15 is formed such that the opening peripheral end face 15B of the opening 15A of the light absorption member 15 is aligned with the opening peripheral end face 11D of the opening 11C of the circuit board 11. Thereby, reflected light from the circuit board 11 can be reduced while the effective pixel region of the imaging device 13 is maximized. Thereby, a reduction in image quality can be restricted, and further downsizing of the electronic component 10 and the camera module 1 mounting the same can be achieved.

Further, the light absorption member 15 is formed in only a region other than the opening 11C on the upper face 11A of the circuit board 11. Thus, the light absorption member 15 can be directly formed on the upper face 11A of the circuit board 11 by applying resin or dye or in a film forming method. Thereby, the light absorption member 15 is tightly adhered to the circuit board 11, and thus the light absorption member 15 and the circuit board 11 are less likely to release from each other than in a case where the light absorption member 15 made of a sheet member is adhered to the circuit board 11 (or the translucent member 14), for example. Thereby, reliability of the electronic component 10 is enhanced.

<2.4. Variant>

A variant of the present embodiment will be described below. FIG. 4 is a cross-section view illustrating an exemplary configuration of an electronic component 10A according to the variant of the present embodiment. Additionally, the parts in the electronic component 10A illustrated in FIG. 4 corresponding to those in the electronic component 10 illustrated in FIG. 2 are denoted with the common reference numerals.

With reference to FIG. 4, a light absorption member 15a according to the present variant is formed in a region opposed to the translucent member 14 and except the opening 11C on the upper face 11A of the circuit board 11. At this time, the light absorption member 15a includes the opening 15A at a position corresponding to the opening 11C of the circuit board 11 as illustrated in FIG. 4. The light absorption member 15a is then formed such that the opening peripheral end face 15B of the opening 15A of the light absorption member 15a is outside the opening peripheral end face 11D of the opening 11C of the circuit board 11 with respect to the arrangement of the imaging device 13 in plan view. Additionally, the light absorption member 15a according to the present variant may be made of an absorbent material such as dye containing a black material, resin, or film. Further, the light absorption member 15a may have a function as an adhesive for adhering the mutually-opposed faces of the circuit board 11 and the translucent member 14 as described above.

Reflection of light reaching the light absorption member 15a can be reduced in the configuration of the light absorption member 15a, thereby restricting a reduction in image quality due to flare, ghost, or the like caused by reflected light from the circuit board 11. Further, the light absorption member 15a is formed on the upper face 11A of the circuit board 11, and thus a positional offset of the light absorption member 15a is less likely to be caused when the circuit board 11 and the translucent member 14 are bonded. Thus, the positioning accuracy of the light absorption member 15a is increased, and thus the effective pixel region of the imaging device 13 is less likely to vary. Further, the light absorption member 15a is formed in only a region other than the opening 11C on the upper face 11A of the circuit board 11. Thus, the light absorption member 15a can be directly formed on the upper face 11A of the circuit board 11 by applying dye or in a film forming method. Thereby, the light absorption member 15a and the circuit board 11 are less likely to release from each other. Thus, reliability of the electronic component 10 is enhanced.

Further, the light absorption member 15 is formed such that the opening peripheral end face 15B of the opening 15A of the light absorption member 15a is outside the opening peripheral end face 11D of the opening 11C of the circuit board 11 with respect to the imaging device 13. Thereby, the circuit board 11 and the light absorption member 15a are less likely to delaminate than in a case where the two opening peripheral end faces are aligned and the opening peripheral end face 15B of the opening 15A of the light absorption member 15a is inside the opening peripheral end face 11D of the opening 11C of the circuit board 11 with respect to the imaging device 13. Thereby, reliability of the electronic component 10 can be further enhanced.

Additionally, the light absorption member 15 is not limited to the above example, and may be formed at any position except the opening 11C on the upper face 11A of the circuit board 11. For example, the light absorption member 15 may be discontinuously formed in the region. Also in this case, reflected light from the circuit board 11 can be reduced.

<2.5. Method for Manufacturing Electronic Component>

A method for manufacturing the electronic component 10 according to the present embodiment will be described below. (1) a method for forming the light absorption member 15 and (2) packaging the electronic component 10 will be described herein.

(1) Method for Forming Light Absorption Member 15

FIG. 5A, FIG. 5B, and FIG. 5C and FIG. 6A, FIG. 6B, and FIG. 6C are schematic diagrams illustrating exemplary steps in the methods for forming the light absorption member 15 (15a) according to the present embodiment and the present variant, respectively. FIG. 5A, FIG. 5B, and FIG. 5C and FIG. 6A, FIG. 6B, and FIG. 6C are diagrams of the circuit board 11 and the formed light absorption member 15 viewed from above.

Figure 5B:
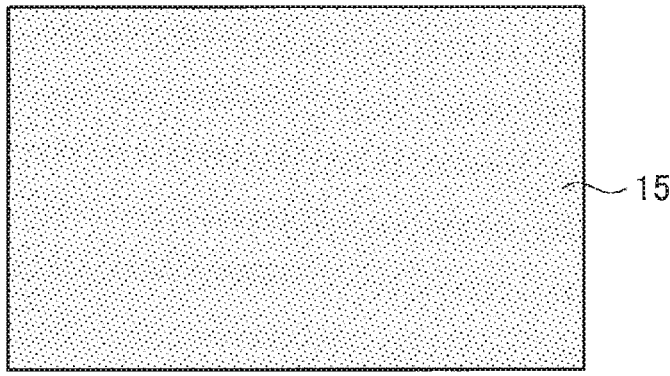
FIG. 5B is a schematic diagram illustrating an exemplary step in the method for forming the light absorption member according to the embodiment.

The method for forming the light absorption member 15 according to the present embodiment will be described with reference to FIG. 5A, FIG. 5B, and FIG. 5C. At first, the circuit board 11 illustrated in FIG. 5A is prepared. Then, as illustrated in FIG. 5B, the light absorption member 15 is formed on the entire surface of the circuit board 11. The light absorption member 15 is formed by application of dye, printing, film formation such as sputtering, adherence of resin, or the like, for example.

Figure 5C:
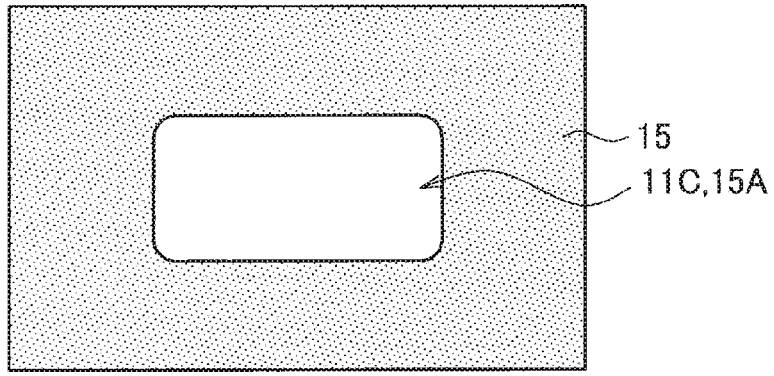
FIG. 5C is a schematic diagram illustrating an exemplary step in the method for forming the light absorption member according to the embodiment.

Then, as illustrated in FIG. 5C, the opening 11C is formed at a predetermined part of the circuit board 11 with the light absorption member 15 formed. The opening 11C is formed by punching, for example. At this time, the opening 15A is formed also in the light absorption member 15.

In the method for forming the light absorption member 15 illustrated in FIG. 5A, FIG. 5B, and FIG. 5C, the openings can be formed on the circuit board 11 and the light absorption member 15 at one time. Thereby, the manufacture steps are reduced and the positioning accuracy of the light absorption member 15 is enhanced, and thus reliability of the electronic component 10 can be enhanced.

Additionally, the circuit board 11 may be previously subjected to via processing before the light absorption member 15 illustrated in FIG. 5B is formed on the circuit board 11. The via processing can be performed at a position to be an opening peripheral end face of the opening 11C. Thereby, punching is facilitated, and the accuracy of the opening 11C of the circuit board 11 and the opening 15A of the light absorption member 15 is enhanced. Further, in a case where the light absorption member 15 is formed after being subjected to via processing, the light absorption member 15 can be formed also on the opening peripheral end face 11D of the opening 11C of the circuit board 11. In this case, reflected light, which can enter the light receiving face 131 from the opening peripheral end face 11D, can be reduced.

Figure 6A:
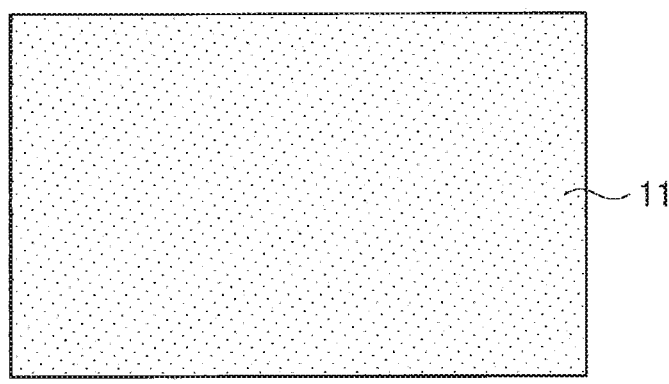
FIG. 6A is a schematic diagram illustrating an exemplary step in a method for forming a light absorption member according to a variant of the embodiment.
Figure 6B:
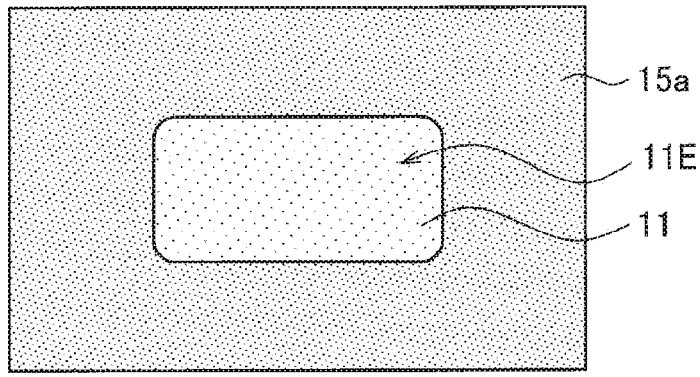
FIG. 6B is a schematic diagram illustrating an exemplary step in the method for forming the light absorption member according to the variant of the embodiment.

A method for forming the light absorption member 15a according to the present variant will be described below with reference to FIG. 6A, FIG. 6B, and FIG. 6C. At first, the circuit board 11 illustrated in FIG. 6A is prepared. Next, the light absorption member 15a is formed in a region other than a region 11E corresponding to the opening 11C on the surface of the circuit board 11 as illustrated in FIG. 6B. The region 11E includes a region where at least the opening 11C is formed. A peripheral end of the region 11E corresponds to the opening peripheral end face 15B of the opening 15A of the light absorption member 15. The light absorption member 15a is formed by application of dye, printing, film formation such as sputtering, adherence of resin, or the like, for example. In this case, the light absorption member 15a has the opening 15A when being formed.

Figure 6C:
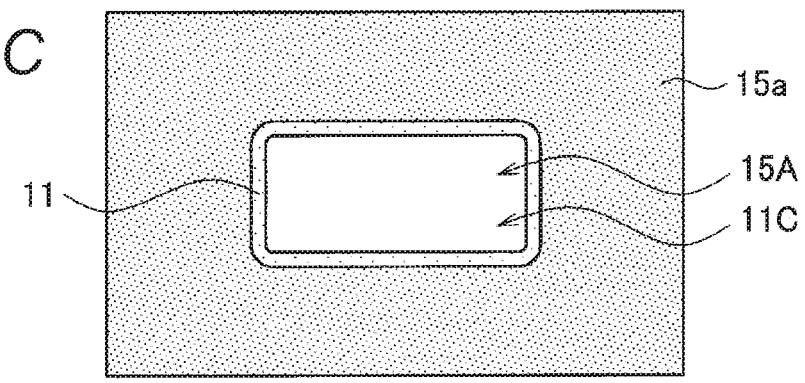
FIG. 6C is a schematic diagram illustrating an exemplary step in the method for forming the light absorption member according to the variant of the embodiment.

Next, the opening 11C is formed at a predetermined part on the circuit board 11 as illustrated in FIG. 6C. The opening 11C is formed by punching, for example.

In the method for forming the light absorption member 15a illustrated in FIG. 6A, FIG. 6B, and FIG. 6C, the opening 15A is previously provided in the light absorption member 15a, and then the opening 11C is formed in the circuit board 11. At this time, the opening 11C is formed inside the opening 15A of the light absorption member 15a as illustrated in FIG. 6C. Thereby, the light absorption member 15a and the circuit board 11 are less likely to delaminate when the opening 11C of the circuit board 11 is formed. Further, the light absorption member 15a is previously formed on the circuit board 11, and thus the positioning accuracy of the light absorption member 15a is enhanced. Thereby, reliability of the electronic component 10 can be enhanced.

Additionally, the methods for forming a light absorption member illustrated in FIG. 5A, FIG. 5B, and FIG. 5C and FIG. 6A, FIG. 6B, and FIG. 6C are merely exemplary, and any method can be employed if a light absorption member is formed in a region other than an opening in the upper face of the circuit board in plan view.

(2) Packaging Electronic Component 10

FIG. 7A, FIG. 7B, FIG. 7C, FIG. 7D, FIG. 7E, and FIG. 7F are schematic diagrams illustrating each exemplary step of packaging the electronic component 10 according to the present embodiment. Each schematic diagram is a diagram of a base material 200 to be packaged which is viewed from above in each step. Manufacturing the electronic component 10 from the base material 200 for flexible board will be described herein by way of example.

Figure 7A:
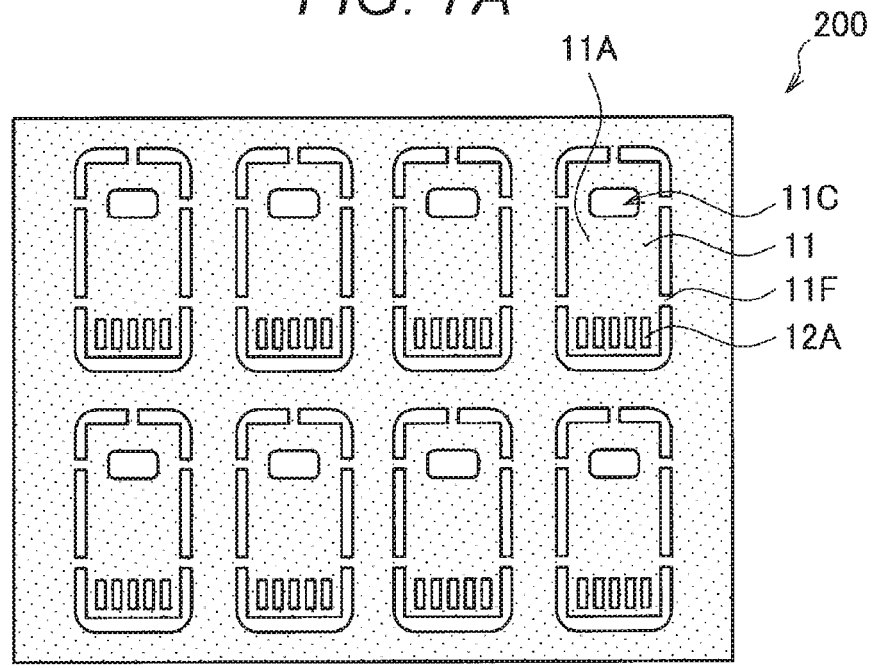
FIG. 7A is a schematic diagram illustrating an exemplary step of packaging the electronic component according to the embodiment.

At first, the base material 200 illustrated in FIG. 7A is a base material of a plurality of circuit boards 11. In FIG. 7A, the base material 200 is arranged such that the upper faces 11A of the circuit boards 11 face upward in the present step. The wiring 12 (the external terminals 12A), the opening 11C, and the light absorption member 15 (face corresponding to the backside of the diagram) are previously formed in each of the circuit board 11 in the base material 200. A plurality of circuit boards 11 is fixed to the base material 200 by board hanging parts 11F. Further, pads (not illustrated) are provided to be exposed around the opening 11C on the upper face 11A of the circuit board 11.

Figure 7B:
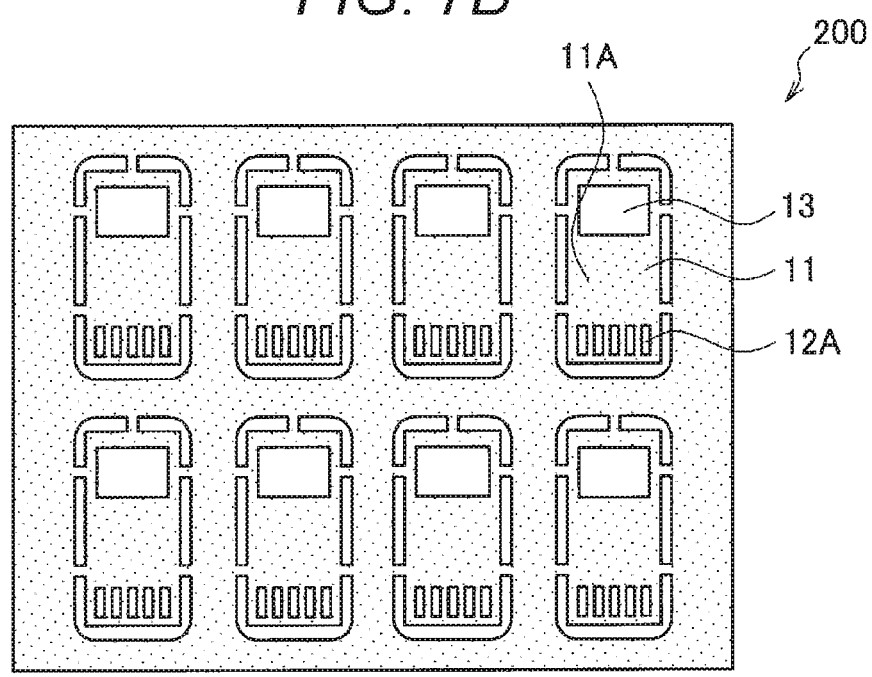
FIG. 7B is a schematic diagram illustrating an exemplary step of packaging the electronic component according to the embodiment.
Figure 7C:
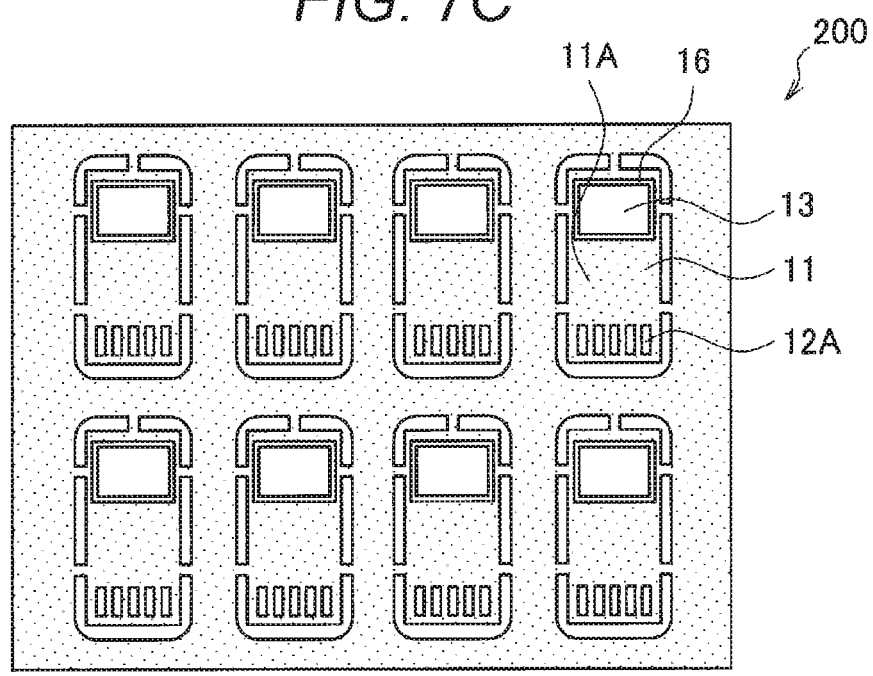
FIG. 7C is a schematic diagram illustrating an exemplary step of packaging the electronic component according to the embodiment.

Next, the imaging device 13 is flip-chip mounted on the upper face 11A of the circuit board 11 as illustrated in FIG. 7B. Then, the encapsulation resin 16 is injected and hardened between the circuit board 11 and the imaging device 13 around the imaging device 13 as illustrated in FIG. 7C. Thereby, a space between the circuit board 11 and the imaging device 13 is sealed and the circuit board 11 and the imaging device 13 are fixed.

Figure 7D:
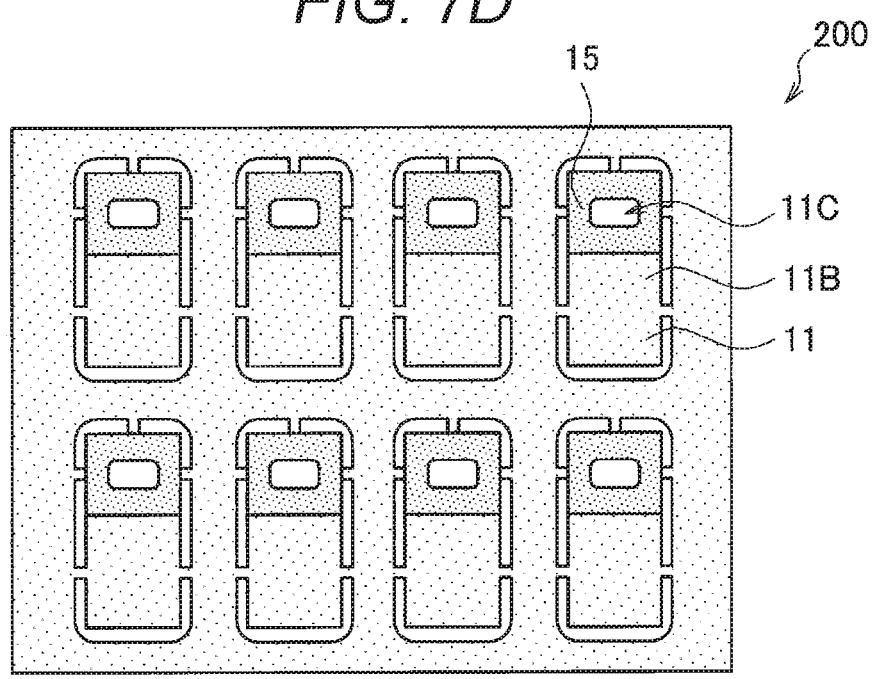
FIG. 7D is a schematic diagram illustrating an exemplary step of packaging the electronic component according to the embodiment.
Figure 7E:
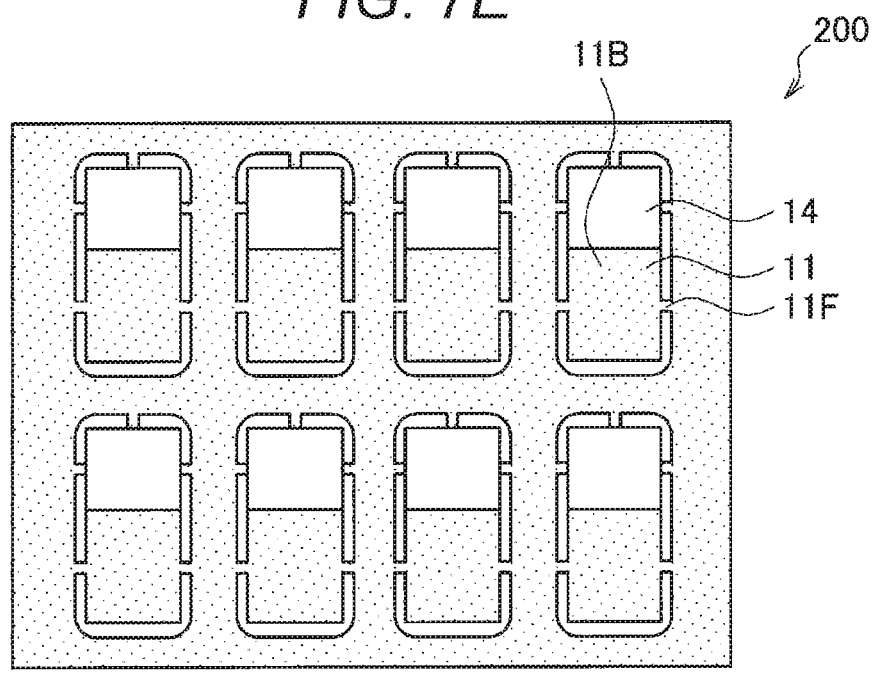
FIG. 7E is a schematic diagram illustrating an exemplary step of packaging the electronic component according to the embodiment.

Next, the base material 200 is inverted such that the lower faces 11B of the circuit boards 11 are positioned above as illustrated in FIG. 7D. Then, the translucent member 14 is arranged to oppose the lower face 11B of the circuit board 11 at a position corresponding to the opening 11C as illustrated in FIG. 7E. At this time, the translucent member 14 is provided to sandwich the light absorption member 15 between the translucent member 14 and the circuit board 11, and is bonded to the light absorption member 15.

Figure 7F:
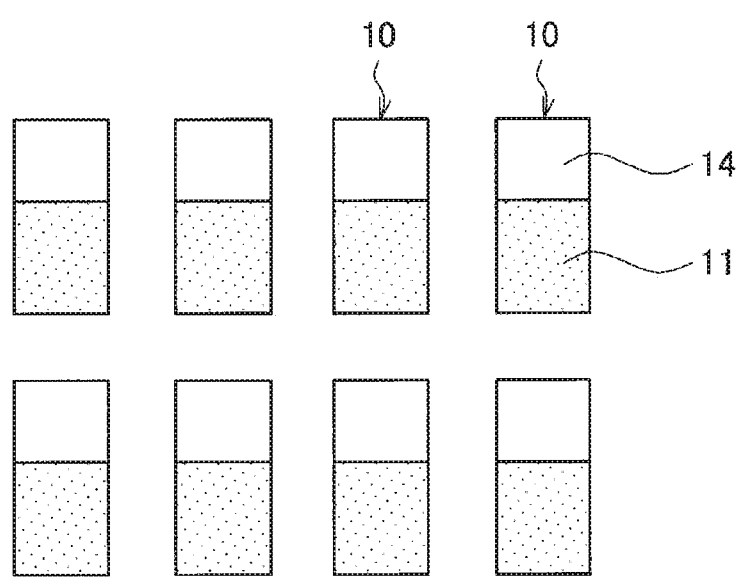
FIG. 7F is a schematic diagram illustrating an exemplary step of packaging the electronic component according to the embodiment.
Figure 16:
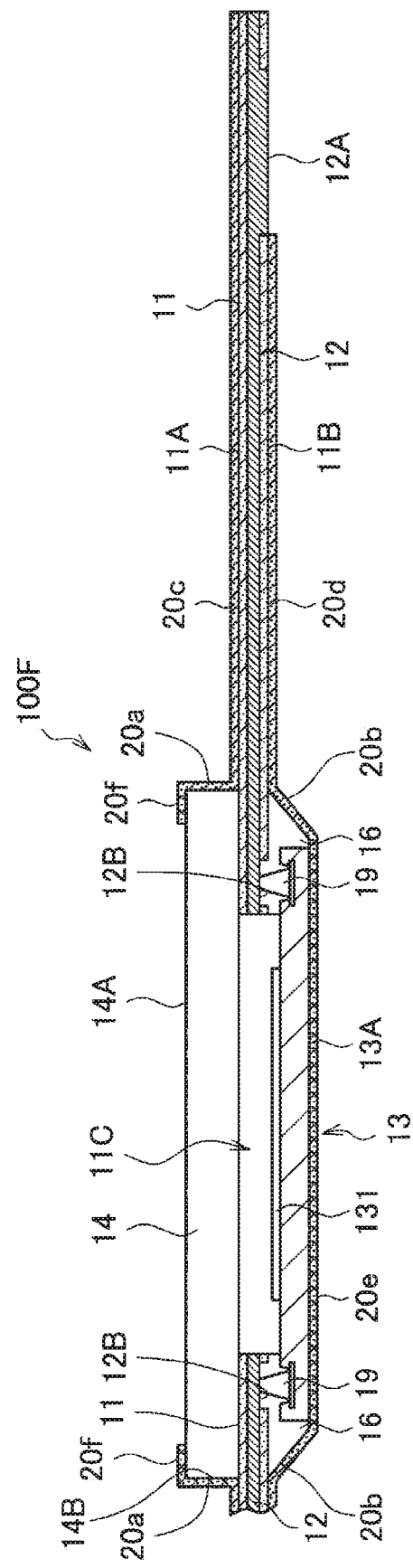
FIG. 16 is a cross-section view illustrating an exemplary configuration of an electronic component according to a sixth variant of the embodiment.

Next, the board hanging parts 11F are cut out so that a plurality of electronic components 10 is obtained from the base material 200 as illustrated in FIG. 7E and FIG. 7F.

Additionally, the steps of packaging the electronic component 10 illustrated in FIG. 7A, FIG. 7B, FIG. 7C, FIG. 7D, FIG. 7E, and FIG. 7F are merely exemplary, and the packaging steps are not limited to the examples as long as the configuration of the electronic component 10 according to the present embodiment can be obtained. For example, the step of flip-chip mounting the imaging device 13 and the step of bonding the translucent member 14 may be performed at the same time, and the order of the steps is not particularly limited.

The first embodiment of the present disclosure has been described above.

3. SECOND EMBODIMENT

A second embodiment of the present disclosure will be described below.

<3.1. Schematic Configuration of Camera Module>

FIG. 8 is a cross-section view illustrating a schematic configuration of a camera module 1A according to a second embodiment of the present disclosure. As illustrated in FIG. 8, the camera module 1A includes the lens unit 2, an electronic component 100, and the reinforcement plate 18. The configurations and functions of the lens unit 2 and the reinforcement plate 18 according to the present embodiment are similar to those in the first embodiment, and thus the description thereof will be omitted.

The electronic component 100 includes the circuit board 11 having the wiring 12, the imaging device 13, the translucent member 14, the encapsulation resin 16, the passive component 17, and light shielding members 20. The electronic component 100 according to the present embodiment is different from that according to the first embodiment in that it includes the light shielding members 20 instead of the light absorption member 15.

<3.2. Configuration of Electronic Component>

An exemplary configuration of the electronic component 100 according to the present embodiment will be described below. FIG. 9 is a cross-section view illustrating an exemplary configuration of the electronic component 100 according to the present embodiment. Additionally, the configuration of the passive component 17 is omitted from FIG. 9.

As illustrated in FIG. 9, the electronic component 100 includes the circuit board 11, the imaging device 13, the translucent member 14, the encapsulation resin 16, and the light shielding members 20a to 20e (denoted as light shielding members 20 when they do not need to be particularly discriminated). The functions of the circuit board 11, the imaging device 13, the translucent member 14, and the encapsulation resin 16 according to the present embodiment are similar to those in the first embodiment, and thus the description thereof will be omitted. Additionally, according to the present embodiment, the translucent member 14 is directly bonded to the upper face 11A of the circuit board 11 by adhesive resin or the like (not illustrated).

According to the present embodiment, the light shielding members 20 can be provided at each constituent in the electronic component 100 as illustrated in FIG. 9. For example, the light shielding member 20a is formed on an outer peripheral end face 14B of the translucent member 14. The light shielding member 20a may be previously formed before the electronic component 100 is mounted, or may be formed after it is mounted, for example.

Further, the light shielding member 20b may be formed on an outer surface 16A of the encapsulation resin 16. The light shielding member 20b may be formed after the encapsulation resin 16 is provided and hardened between the circuit board 11 and the imaging device 13, for example.

Further, the light shielding member 20c may be formed on the upper face 11A of the circuit board 11 outside the translucent member 14 in plan view. The light shielding member 20c may be previously formed before the electronic component 100 is mounted, or may be formed after it is mounted, for example.

Further, the light shielding member 20d may be formed on the lower face 11B of the circuit board 11 outside the translucent member 14 in plan view. The light shielding member 20d may be previously formed before the electronic component 100 is mounted, or may be formed after it is mounted, for example.

Further, the light shielding member 20e may be formed on a face (backside face) 13A opposite to the light receiving face 131 of the imaging device 13. The light shielding member 20e may be previously formed before the electronic component 100 is mounted, or may be formed after it is mounted, for example.

The light shielding members 20 according to the present embodiment are made of a light shielding material. For example, the light shielding members 20 may be made of a similar material to the material making the light absorption member 15 according to the first embodiment. Further, the light shielding members 20 may not necessarily be absorbent.

The light shielding members 20 can be formed by applying light shielding resin or dye on the surface of each member, for example. Further, the light shielding members 20 can be formed by printing a light shielding ink on the surface of each member. Further, the light shielding members 20 can be formed as a light shielding film on the surface of each member by use of a film forming method such as sputtering.

Additionally, the light shielding members 20 may be metal films, for example. The metal films can be formed by sputtering or the like, for example. The metal films can serve as electromagnetic shield, thereby restricting a noise from mixing into an electric signal obtained by converting light incident into the imaging device 13.

<3.3. Operations and Effects>

FIG. 10 is a diagram for explaining operations and effects of the electronic component 100 according to the present embodiment. The cross-section view of the electronic component 100 illustrated in FIG. 10 is the same as the cross-section view illustrated in FIG. 9.

As illustrated in FIG. 10, stray light R2 to invade inside the electronic component 100 from the outer peripheral end face 14B of the translucent member 14 is shielded by the light shielding member 20a. Similarly, stray light R3 to invade inside the electronic component 100 from the outer surface 16A of the encapsulation resin 16 is shielded by the light shielding member 20b. Further, stray light R4a and R4b to invade from the upper face 11A or the lower face 11B of the circuit board 11 are shielded by the light shielding members 20c and 20d. Further, light R5 to pass inside the imaging device 13 from the backside face 13A of the imaging device 13 is shielded by the light shielding member 20e.

Thus, a light shielding member 20 is provided at each of the above members so that stray light is shielded, thereby restricting a reduction in image quality due to flare, ghost, or the like caused by stray light which can invade inside the electronic component 100 from the outside.

Further, the light shielding members 20 can be formed lateral to or below the imaging device 13 such as on the outer peripheral end face 14B of the translucent member 14 or on the outer surface 16A of the encapsulation resin 16. Therefore, the specification of the imaging device 13 or an interference with other member does not need to be considered. Thus, the effective pixel region is less likely to vary, and an effect of restricting a reduction in image quality due to the stray light can be obtained even if the electronic component 100 is downsized.

Additionally, in the example illustrated in FIG. 9, the light shielding members 20 are formed over the entire surface of each member, but the present technology is not limited to the example. For example, the light shielding members 20 may be partially formed on the surface of each member. Also in this case, stray light can be shielded.

<3.4. Variants>

Variants of the present embodiment will be described below. FIG. 11 to FIG. 16 are cross-section views illustrating exemplary configurations of the electronic components 100A to 100F according to the first to sixth variants of the present embodiment, respectively. Additionally, the parts corresponding to those in the electronic component 100 illustrated in FIG. 9 are denoted with the common reference numerals in the electronic components 100A to 100F illustrated in each diagram.

(First Variant)

With reference to FIG. 11, the light shielding member 20a is formed only on the outer peripheral end face 14B of the translucent member 14 in the electronic component 100A according to the first variant of the present embodiment. Also in this case, stray light to invade inside the electronic component 100 from the outer peripheral end face 14B of the translucent member 14 is shielded by the light shielding member 20a as illustrated in FIG. 10. Therefore, an occurrence of flare or ghost due to stray light can be restricted.
(Second Variant)

With reference to FIG. 12, the light shielding members 20a and 20b are formed on the outer peripheral end face 14B of the translucent member 14 and on the outer surface 16A of the encapsulation resin 16 in the electronic component 100B according to the second variant of the present embodiment. In this case, stray light to invade inside the electronic component 100 from the outer peripheral end face 14B of the translucent member 14 and stray light to invade inside the electronic component 100 from the outer surface 16A of the encapsulation resin 16 are shielded by the light shielding members as illustrated in FIG. 10. Thereby, an occurrence of flare or ghost due to stray light can be restricted.
(Third Variant)

With reference to FIG. 13, the light shielding members 20a and 20c are formed on the outer peripheral end face 14B of the translucent member 14 and on the upper face 11A of the circuit board 11 outside the translucent member 14 in plan view in the electronic component 100C according to the third variant of the present embodiment. In this case, stray light to invade inside the electronic component 100 from the outer peripheral end face 14B of the translucent member 14 and stray light to invade from the upper face 11A of the circuit board 11 are shielded by the light shielding members as illustrated in FIG. 10. Thereby, an occurrence of flare or ghost due to stray light can be restricted.
(Fourth Variant)

With reference to FIG. 14, the light shielding members 20a, 20c, and 20d are formed on the outer peripheral end face 14B of the translucent member 14 as well as on the upper face 11A and the lower face 11B of the circuit board 11 outside the translucent member 14 in plan view in the electronic component 100D according to the fourth variant of the present embodiment. In this case, stray light to invade inside the electronic component 100 from the outer peripheral end face 14B of the translucent member 14, and stray light to invade from the upper face 11A and the lower face 11B of the circuit board 11 are shielded by the light shielding members as illustrated in FIG. 10. Thereby, an occurrence of flare of ghost due to stray light can be restricted. Additionally, the light shielding member 20d can be formed only on the lower face 11B of the circuit board 11 outside the translucent member 14 in plan view.
(Fifth Variant)

With reference to FIG. 15, the light shielding members 20a and 20e are formed on the outer peripheral end face 14B of the translucent member 14 and on the backside face 13A of the imaging device 13 in the electronic component 100E according to the fifth variant of the present embodiment. In this case, stray light likely to invade inside the electronic component 100 from the outer peripheral end face 14B of the translucent member 14 and light likely to pass inside the imaging device 13 from the backside face 13A of the imaging device 13 are shielded by the light shielding members as illustrated in FIG. 10. Thereby, an occurrence of flare or ghost due to stray light can be restricted.
(Sixth Variant)

A light shielding member 20f is formed in at least part of a region other than the opening 11C of the circuit board 11 in plan view on the upper face 14A of the translucent member 14 in addition to the light shielding members 20a to 20e in the electronic component 100F according to the sixth variant of the present embodiment. In the example illustrated in FIG. 16, the light shielding member 20f is formed along the outer peripheral end face 14B on the upper face 14A of the translucent member 14 near the outer peripheral end face 14B. The light shielding member 20f does not shield light passing through the opening 13C and directly entering the light receiving face 131 of the imaging device 13 among the light collected by the group of lenses 3, but can shield light toward the upper face 11A of the circuit board 11. Thereby, an occurrence of flare of ghost due to light reflected on the circuit board 11 can be restricted.

Each variant of the present embodiment has been described above. Additionally, the light shielding members 20a to 20e according to each of the above variants can be mutually combined. For example, in other variant, the light shielding members 20a, 20b, 20c, and 20d may be formed in each member of the electronic component 100, or the light shielding members 20a, 20c, 20d, and 20e may be formed in each member of the electronic component 100. Further, only any of the light shielding members 20b, 20c, 20d, and 20e may be formed in each member of the electronic component 100.

The second embodiment of the present disclosure has been described above.

4. THIRD EMBODIMENT

A third embodiment of the present disclosure will be described below.

Figure 17:
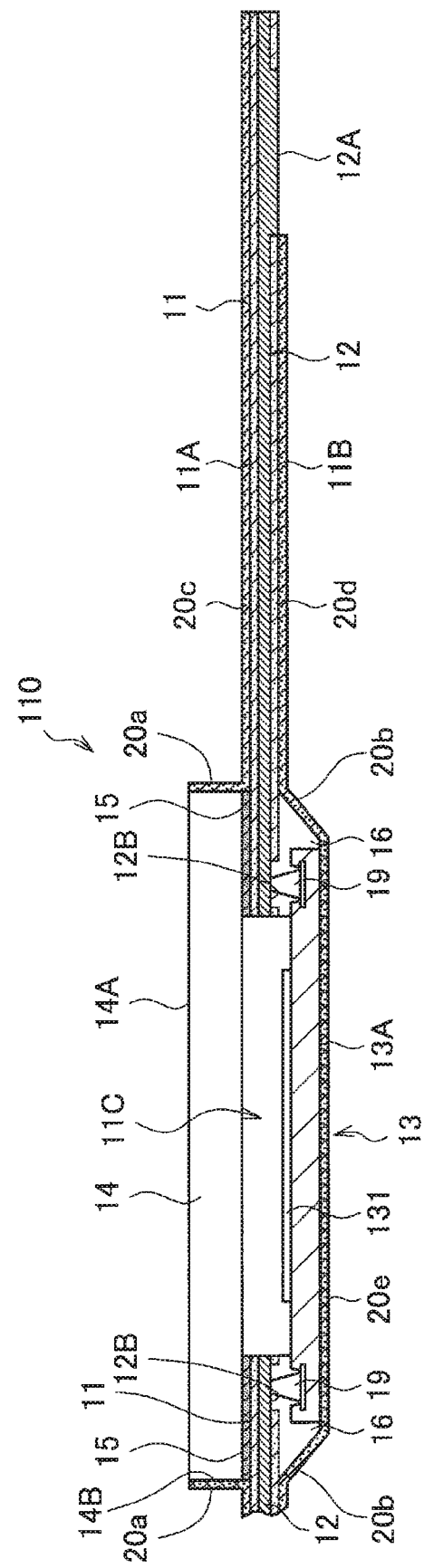
FIG. 17 is a cross-section view illustrating an exemplary configuration of an electronic component 110 according to a third embodiment of the present disclosure.

FIG. 17 is a cross-section view illustrating an exemplary configuration of an electronic component 110 according to the third embodiment of the present disclosure. As illustrated in FIG. 17, the electronic component 110 includes the circuit board 11, the imaging device 13, the translucent member 14, the light absorption member 15, the encapsulation resin 16, and the light shielding members 20 (20a to 20e). That is, the electronic component 110 according to the present embodiment includes both the light absorption member 15 according to the first embodiment of the present disclosure and the light shielding members 20 according to the second embodiment of the present disclosure. The materials making the light absorption member 15 and the light shielding members 20 conform to the materials making the light absorption member and the light shielding members described in each of the above embodiments.

With the configuration, reflected light from the circuit board 11 can be reduced and a stay light can be prevented from invading from the side of or from below the electronic component 110 as described in the first embodiment and the second embodiment. Thereby, a reduction in image quality due to flare, ghost, or the like caused by both reflected light and stray light can be restricted.

Additionally, as described in the variant of the second embodiment, all the light shielding members 20a to 20e may not necessarily be formed on the surface of each member in the electronic component 110. As long as at least any of the light shielding members 20a to 20e is formed on the surface of each member in the electronic component 110, a reduction in image quality due to flare, ghost, or the like caused by stray light can be restricted.

<<5. Application to In-Vivo Information Acquisition System>>

The technology according to the present disclosure (the present technology) can be applied to various products. For example, the technology according to the present disclosure may be applied to an endoscopic surgery system.

Figure 18:
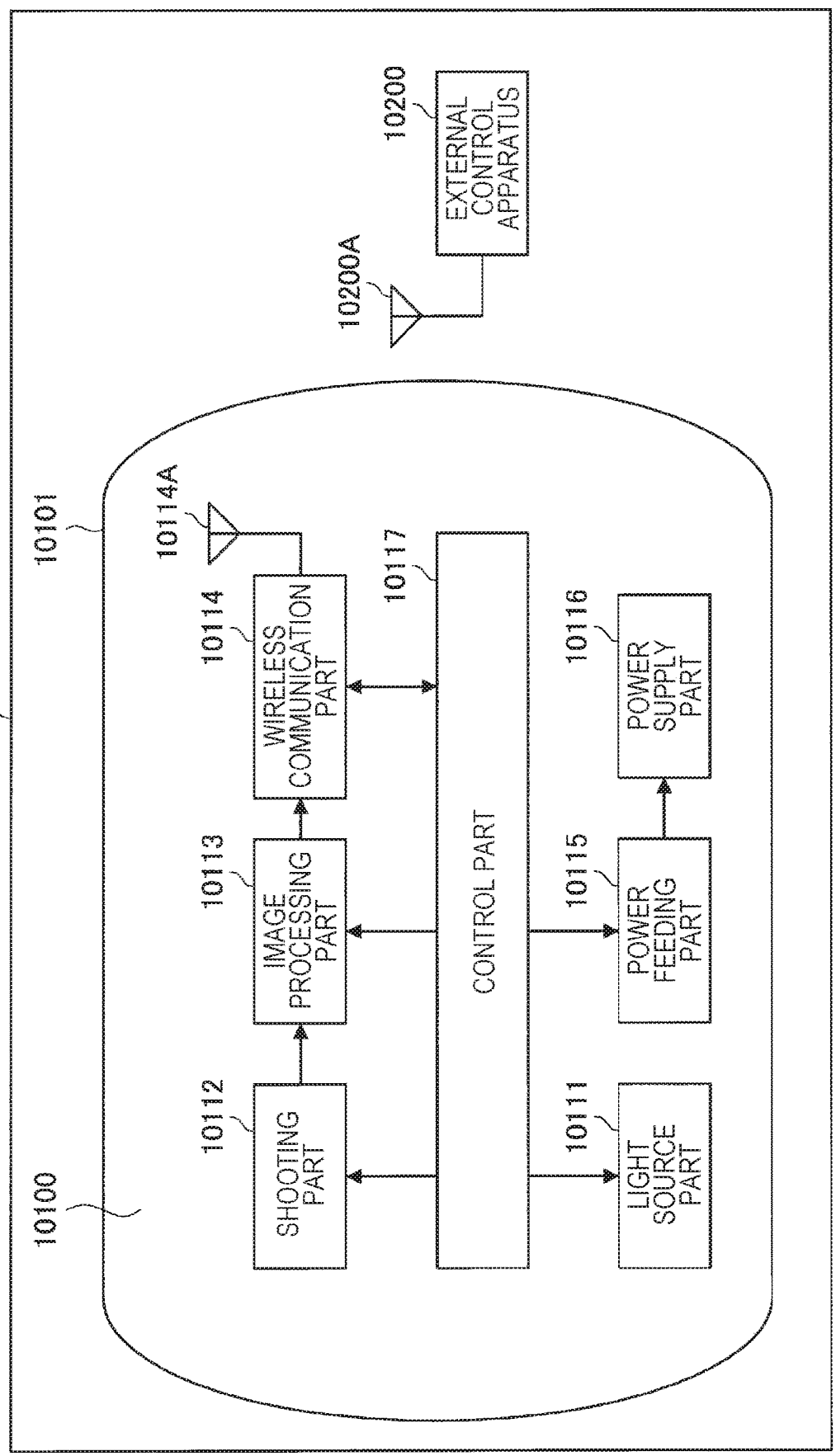
FIG. 18 is a block diagram illustrating an exemplary schematic configuration of an in-vivo information acquisition system.

FIG. 18 is a block diagram illustrating an exemplary schematic configuration of a patient's in-vivo information acquisition system by use of a capsule endoscope to which the technology according to the present disclosure (the present technology) is applicable.

An in-vivo information acquisition system 10001 is configured of a capsule endoscope 10100 and an external control apparatus 10200.

The capsule endoscope 10100 is swallowed by a patient on examination. The capsule endoscope 10100 has a shooting function and a wireless communication function, and sequentially shoots images of the inside of organs (also denoted as in-vivo image) at predetermined intervals and sequentially and wirelessly transmits the information indicating the in-vivo images to the external control apparatus 10200 outside the body while moving through the organs such as stomach and intestines by peristalsis or the like until it is naturally expelled from the patient.

The external control apparatus 10200 totally controls the operations of the in-vivo information acquisition system 10001. Further, the external control apparatus 10200 receives the information indicating the in-vivo images transmitted from the capsule endoscope 10100, and generates image data for displaying the in-vivo images on a display apparatus (not illustrated) on the basis of the received information indicating the in-vivo images.

The in-vivo information acquisition system 10001 can acquire the in-vivo images shooting the inside of the patient's body as needed in this way until the capsule endoscope 10100 is expelled after it is swallowed.

The configurations and functions of the capsule endoscope 10100 and the external control apparatus 10200 will be described in more detail.

The capsule endoscope 10100 includes a capsule casing 10101, and the casing 10101 houses a light source part 10111, a shooting part 10112, an image processing part 10113, a wireless communication part 10114, a power feeding part 10115, a power supply part 10116, and a control part 10117 therein.

The light source part 10111 is configured of, for example, a light source such as light emitting diode (LED), and irradiates a shooting field of the shooting part 10112 with light.

The shooting part 10112 is configured of an optical system including an imaging device and a plurality of lenses provided in front of the imaging device. Reflected light of light (denoted as observation light below) with which a body tissue as an object to be observed is irradiated is collected by the optical system and enters the imaging device. The observation light entering the imaging device is photoelectrically converted and an image signal corresponding to the observation light is generated in the shooting part 10112. The image signal generated by the shooting part 10112 is provided to the image processing part 10113.

The image processing part 10113 is configured of a processor such as central processing unit (CPU) or graphics processing unit (GPU), and performs various signal processing on the image signal generated by the shooting part 10112. The image processing part 10113 provides the image signal subjected to a signal processing as RAW data to the wireless communication part 10114.

The wireless communication part 10114 performs a predetermined processing such as modulation processing on the image signal subjected to the signal processing by the image processing part 10113, and transmits the image signal to the external control apparatus 10200 via an antenna 10114A. Further, the wireless communication part 10114 receives a control signal for driving and controlling the capsule endoscope 10100 from the external control apparatus 10200 via the antenna 10114A. The wireless communication part 10114 provides the control signal received from the external control apparatus 10200 to the control part 10117.

The power feeding part 10115 is configured of a power reception antenna coil, a power regeneration circuit for regenerating power from a current generated in the antenna coil, a booster circuit, and the like. The power feeding part 10115 generates power by use of the non-contact charging principle.

The power supply part 10116 is configured of a secondary battery, and accumulates power generated by the power feeding part 10115. The arrows and the like indicating the destinations of power supplied from the power supply part 10116 are omitted in FIG. 18 in order to avoid the complicated diagram, but the power accumulated in the power supply part 10116 is supplied to the light source part 10111, the shooting part 10112, the image processing part 10113, the wireless communication part 10114, and the control part 10117, and is used to drive the parts.

The control part 10117 is configured of a processor such as CPU, and controls driving the light source part 10111, the shooting part 10112, the image processing part 10113, the wireless communication part 10114, and the power feeding part 10115 as needed according to a control signal transmitted from the external control apparatus 10200.

The external control apparatus 10200 is configured of a processor such as CPU or GPU, a microcomputer on which storage devices such as processor and memory are mounted together, a control board, or the like. The external control apparatus 10200 transmits a control signal to the control part 10117 in the capsule endoscope 10100 via an antenna 10200A, thereby controlling the operations of the capsule endoscope 10100. For example, the conditions for irradiating an object to be observed in the light source part 10111 with light can be changed by a control signal from the external control apparatus 10200 in the capsule endoscope 10100. Further, the shooting conditions (such as frame rate and exposure value in the shooting part 10112, for example) can be changed by a control signal from the external control apparatus 10200. Further, the processing contents in the image processing part 10113 and the conditions (such as transmission interval and number of images to be transmitted, for example) for transmitting an image signal in the wireless communication part 10114 may be changed by a control signal from the external control apparatus 10200.

Further, the external control apparatus 10200 performs various image processing on the image signal transmitted from the capsule endoscope 10100, and generates image data for displaying the shot in-vivo images on the display apparatus. For the image processing, various signal processing such as development processing (demosaic processing), image quality increase processing (bandwidth emphasis processing, super-resolution processing, noise reduction (NR) processing and/or blurring correction processing, for example), and/or enlargement processing (electronic zooming processing) can be performed, for example. The external control apparatus 10200 controls driving the display apparatus, and causes it to display the shot in-vivo images on the basis of the generated image data. Alternatively, the external control apparatus 10200 may cause a recording apparatus (not illustrated) to record the generated image data or may cause a printing apparatus (not illustrated) to print out the generated image data.

An exemplary in-vivo information acquisition system to which the technology according to the present disclosure is applicable has been described above. The technology according to the present disclosure is applicable to the shooting part 10112 in the above-described constituents.

Specifically, the camera module 1 according to each embodiment described above can be applied to the shooting part 10112. The technology according to the present disclosure is applied to the shooting part 10112 so that a clearer image of a surgical site can be obtained and the accuracy of examination is enhanced.

6. APPLICATION TO ENDOSCOPIC SURGERY SYSTEM

Further, the technology according to the present disclosure (the present technology) is applicable to various products. For example, the technology according to the present disclosure may be applied to an endoscopic surgery system.

Figure 19:
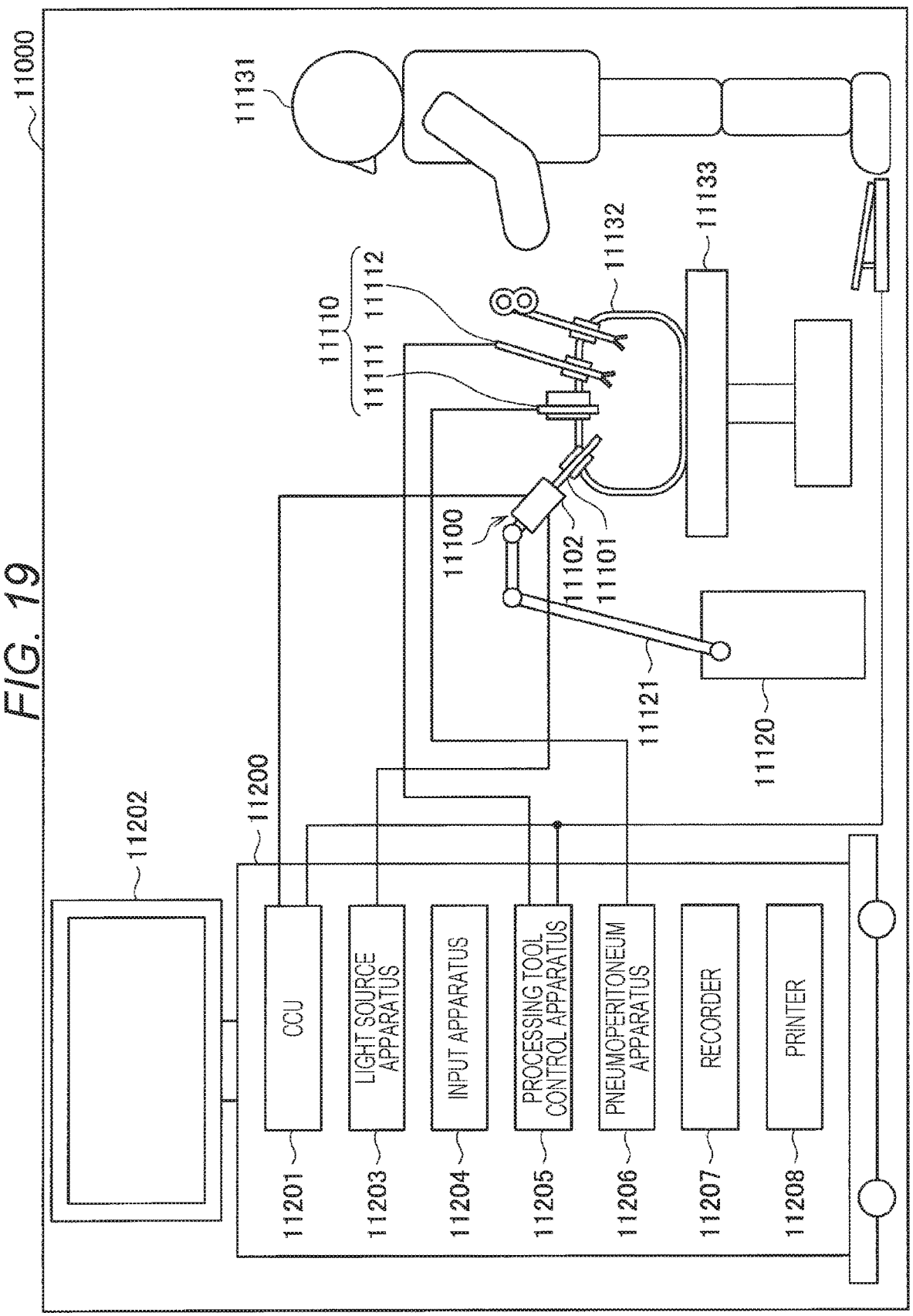
FIG. 19 is a diagram illustrating an exemplary schematic configuration of an endoscopic surgery system.

FIG. 19 is a diagram illustrating an exemplary schematic configuration of an endoscopic surgery system to which the technology according to the present disclosure (the present technology) can be applied.

FIG. 19 illustrates how an operator (doctor) 11131 performs an operation on a patient 11132 on a patient's bed 11133 by use of an endoscopic surgery system 11000. As illustrated, the endoscopic surgery system 11000 is configured of an endoscope 11100, the other surgical instruments 11110 such as pneumoperitoneum tube 11111 and energy treatment tool 11112, a support arm apparatus 11120 for supporting the endoscope 11100, and a cart 11200 on which various apparatuses for endoscopic surgery are mounted.

The endoscope 11100 is configured of a lens tube 11101 the region of which at a predetermined length from the tip is inserted into the body cavity of the patient 11132, and a camera head 11102 connected to the base of the lens tube 11101. In the illustrated example, the endoscope 11100 configured as a rigid scope having the hard lens tube 11101 is illustrated, but the endoscope 11100 may be configured as a flexible scope having a flexible lens tube.

An opening with an objective lens fitted is provided at the tip of the lens tube 11101. A light source apparatus 11203 is connected to the endoscope 11100, and light generated by the light source apparatus 11203 is guided to the tip of the lens tube by a light guide extending into the lens tube 11101, and is applied toward an object to be observed in the body cavity of the patient 11132 via the objective lens. Additionally, the endoscope 11100 may be a direct-viewing lens, or may be an oblique-viewing lens or side-viewing lens.

An optical system and an imaging device are provided inside the camera head 11102, and reflected light (observation light) from an object to be observed is condensed on the imaging device via the optical system. The observation light is photoelectrically converted by the imaging device, and an electric signal corresponding to the observation light, or an image signal corresponding to the observed image is generated. The image signal is transmitted as RAW data to a camera control unit (CCU) 11201.

The CCU 11201 is configured of a central processing unit (CPU), a graphics processing unit (GPU), or the like, and totally controls the operations of the endoscope 11100 and a display apparatus 11202. Further, the CCU 11201 receives an image signal from the camera head 11102, and performs various image processing for displaying an image based on the image signal, such as development processing (demosaic processing), for example, on the image signal.

The display apparatus 11202 displays the image based on the image signal subjected to the image processing by the CCU 11201 under control of the CCU 11201.

The light source apparatus 11203 is configured of, for example, a light source such as light emitting diode (LED), and supplies irradiation light to the endoscope 11100 when shooting a surgical site or the like.

An input apparatus 11204 is an input interface for the endoscopic surgery system 11000. A user can input various items of information or instructions into the endoscopic surgery system 11000 via the input apparatus 11204. For example, the user inputs an instruction to change shooting conditions (such as kind of irradiation light, magnification, and focal distance) of the endoscope 11100 or the like.

A processing tool control apparatus 11205 controls to drive the energy treatment tool 11112 for cauterizing or cutting a tissue, sealing a blood vessel, and the like. A pneumoperitoneum apparatus 11206 feeds gas into the body cavity via the pneumoperitoneum tube 11111 to expand the body cavity of the patient 11132 in order to secure the field of view of the endoscope 11100 and to secure a working space of the operator. A recorder 11207 is an apparatus capable of recording various items of information regarding a surgery. A printer 11208 is an apparatus capable of printing various items of information regarding a surgery in various forms such as text, image, or graph.

Additionally, the light source apparatus 11203 for supplying irradiation light to the endoscope 11100 when shooting a surgical site can be configured of a white light source made of an LED, a laser light source, or a combination thereof, for example. In a case where the white light source is configured in a combination of RGB laser light sources, the output intensity and the output timing of each color (each wavelength) can be controlled with high accuracy, and thus the white balance of a shot image can be adjusted in the light source apparatus 11203. Further, in this case, an object to be observed is irradiated with beams of laser light from the respective RGB laser light sources in a time division manner, and the imaging device in the camera head 11102 is controlled to be driven in synchronization with the irradiation timings, thereby shooting the images corresponding to RGB in a time division manner. According to the method, a color image can be obtained without a color filter in the imaging device.

Further, the light source apparatus 11203 may be controlled to be driven for changing the intensity of light to be output at a predetermined time. The imaging device in the camera head 11102 is controlled to be driven in synchronization with the timings to change the intensities of the beams of light thereby to obtain images in a time division manner, and the images are combined thereby to generate an image with a high dynamic range without blocked-up shadows and blown-out highlights.

Further, the light source apparatus 11203 may be configured to supply light in a predetermined wavelength band corresponding to special light observation. Under the special light observation, for example, light in a narrower band than irradiation light (or white light) during normal observation is applied by use of the wavelength dependency of absorption of light in a body tissue, thereby performing narrow band imaging for shooting a predetermined tissue such as blood vessel in the superficial portion of the mucous membrane at high contrast. Alternatively, under the special light observation, fluorescent observation for obtaining an image by fluorescence caused by irradiation of excitation light may be performed. Under the fluorescent observation, a body tissue can be irradiated with excitation light thereby to observe fluorescence from the body tissue (autofluorescence observation), a reagent such as indocyanine green (ICG) can be locally injected into a body tissue, and the body tissue can be irradiated with excitation light corresponding to the fluorescent wavelength of the reagent thereby to obtain a fluorescent image, for example. The light source apparatus 11203 can be configured to supply a narrowband light and/or excitation light corresponding to the special light observation.

Figure 20:
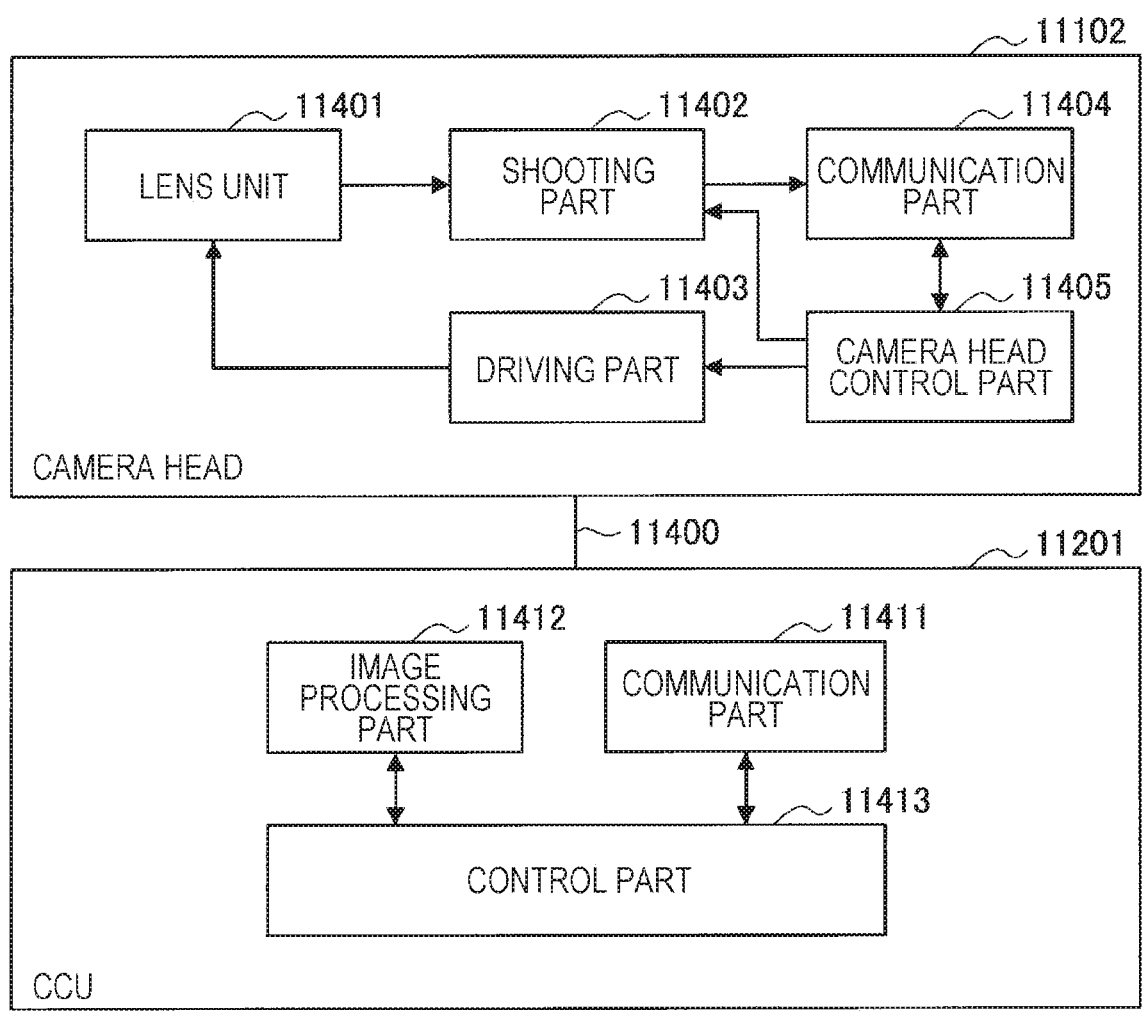
FIG. 20 is a block diagram illustrating an exemplary functional configuration of a camera head and a CCU.

FIG. 20 is a block diagram illustrating an exemplary functional configuration of the camera head 11102 and the CCU 11201 illustrated in FIG. 19.

The camera head 11102 has a lens unit 11401, a shooting part 11402, a driving part 11403, a communication part 11404, and a camera head control part 11405. The CCU 11201 has a communication part 11411, an image processing part 11412, and a control part 11413. The camera head 11102 and the CCU 11201 are communicably connected to each other via a transmission cable 11400.

The lens unit 11401 is an optical system provided at the connection part to the lens tube 11101. An observation light taken from the tip of the lens tube 11101 is guided to the camera head 11102, and is incident into the lens unit 11401. The lens unit 11401 is configured in a combination of a plurality of lenses including a zoom lens and a focus lens.

The shooting part 11402 is configured of an imaging device. One imaging device (or single plate) or a plurality of imaging devices (or multiplate) may configure the shooting part 11402. In a case where the shooting part 11402 is configured in multiplate, the image signals corresponding to RGB may be generated by the imaging devices, respectively, and combined thereby to obtain a color image, for example. Alternatively, the shooting part 11402 may have a pair of imaging devices for obtaining right-eye and left-eye image signals for 3 dimensional (D) display. 3D display is performed so that the operator 11131 can more accurately grasp the depth of a body tissue at a surgical site. Additionally, in a case where the shooting part 11402 is configured in multiplate, a plurality of lens units 11401 corresponding to the imaging devices can be provided, respectively.

Further, the shooting part 11402 may not necessarily be provided in the camera head 11102. For example, the shooting part 11402 may be provided immediately behind the objective lens inside the lens tube 11101.

The driving part 11403 is configured of an actuator, and moves the zoom lens and the focus lens in the lens unit 11401 by a predetermined distance along the optical axis under control of the camera head control part 11405. Thereby, the magnification and the focal point of an image shot by the shooting part 11402 can be adjusted as needed.

The communication part 11404 is configured of a communication apparatus for exchanging various items of information with the CCU 11201. The communication part 11404 transmits an image signal obtained from the shooting part 11402 as RAW data to the CCU 11201 via the transmission cable 11400.

Further, the communication part 11404 receives a control signal for controlling to drive the camera head 11102 from the CCU 11201, and supplies it to the camera head control part 11405. The control signal includes information for designating a frame rate of a shot image, information for designating an exposure value on shooting, and/or information for designating the magnification and the focal point of a shot image and the like, for example.

Additionally, the shooting conditions such as frame rate, exposure value, magnification, and focal point may be designated by the user as needed, or may be automatically set by the control part 11413 in the CCU 11201 on the basis of the obtained image signal. In the latter case, the auto exposure (AE) function, the auto focus (AF) function, and the auto white balance (AWB) function are mounted on the endoscope 11100.

The camera head control part 11405 controls to drive the camera head 11102 on the basis of the control signal from the CCU 11201 received via the communication part 11404.

The communication part 11411 is configured of a communication apparatus for exchanging various items of information with the camera head 11102. The communication part 11411 receives an image signal transmitted from the camera head 11102 via the transmission cable 11400.

Further, the communication part 11411 transmits the control signal for controlling to drive the camera head 11102 to the camera head 11102. The image signal or control signal can be transmitted via electric communication, optical communication, or the like.

The image processing part 11412 performs various image processing on the image signal as RAW data transmitted from the camera head 11102.

The control part 11413 performs various controls for shooting a surgical site or the like by the endoscope 11100 and displaying a shot image obtained by shooting a surgical site or the like. For example, the control part 11413 generates the control signal for controlling to drive the camera head 11102.

Further, the control part 11413 causes the display apparatus 11202 to display a shot image shooting a surgical site or the like therein on the basis of the image signal subjected to the image processing by the image processing part 11412. At this time, the control part 11413 may recognize various objects in the shot image by use of various image recognition technologies. For example, the control part 11413 detects the shapes, colors, and the like of the edges of the objects included in the shot image thereby to recognize a surgical tool such as forceps, a specific living body site, bleeding, mist during the use of the energy treatment tool 11112, and the like. When causing the display apparatus 11202 to display a shot image, the control part 11413 may overlap various items of surgery support information on the image of the surgical site to be displayed by use of the recognition result. The surgery support information is overlapped to be displayed, and is presented to the operator 11131 so that the loads on the operator 11131 can be alleviated and the operator 11131 can securely perform the operation.

The transmission cable 11400 connecting the camera head 11102 and the CCU 11201 is an electric signal cable for communication of electric signals, an optical fiber for optical communication, or a composite cable thereof.

Here, wired communication is made by use of the transmission cable 11400 in the illustrated example, but wireless communication may be made between the camera head 11102 and the CCU 11201.

An exemplary endoscopic surgery system to which the technology according to the present disclosure can be applied has been described above. The technology according to the present disclosure can be applied to the camera head 11102 among the above-described constituents, for example. Specifically, the electronic component 10 in the camera module 1 according to each embodiment described above can be applied to the shooting part 11402. The technology according to the present disclosure is applied to the shooting part 11402 so that a clearer image of a surgical site can be obtained and the operator can securely confirm the surgical site.

Additionally, the endoscopic surgery system has been described herein by way of example, but the technology according to the present disclosure may be additionally applied to a microscopic surgery system and the like, for example.

7. APPLICATION TO MOVING OBJECT

Further, the technology according to the present disclosure (the present technology) is applicable to various products. For example, the technology according to the present disclosure may be realized as an apparatus mounted on any kind of moving object such as vehicle, electric vehicle, hybrid vehicle, motorcycle, bicycle, personal mobility, airplane, drone, ship, or robot.

Figure 21:
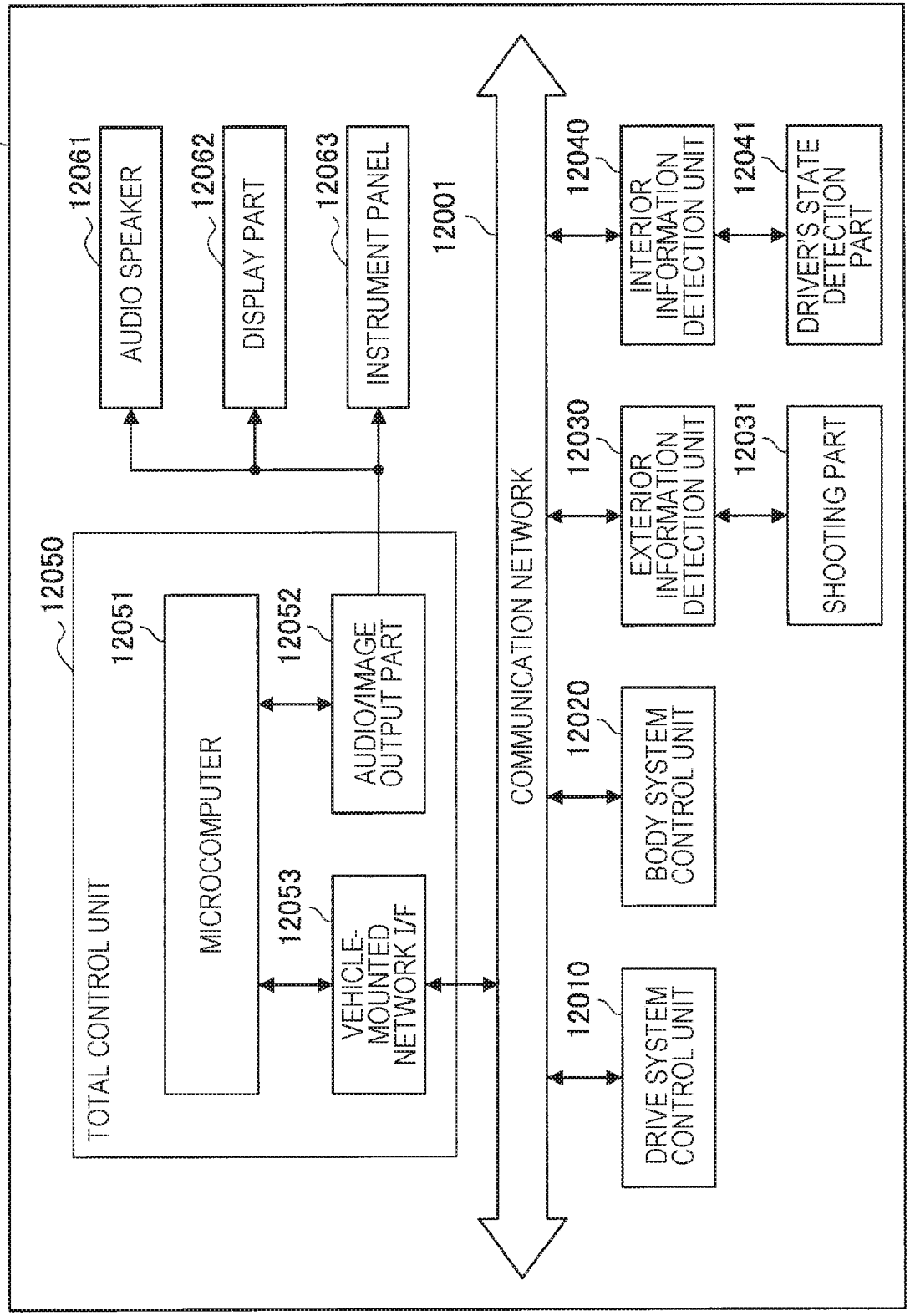
FIG. 21 is a block diagram illustrating an exemplary schematic configuration of a vehicle control system.

FIG. 21 is a block diagram illustrating an exemplary schematic configuration of a vehicle control system as an exemplary moving object control system to which the technology according to the present disclosure can be applied.

A vehicle control system 12000 includes a plurality of electronic control units connected via a communication network 12001. In the example illustrated in FIG. 21, the vehicle control system 12000 includes a drive system control unit 12010, a body system control unit 12020, an exterior information detection unit 12030, an interior information detection unit 12040, and a total control unit 12050. Further, a microcomputer 12051, an audio/image output part 12052, and a vehicle-mounted network interface (I/F) 12053 are illustrated as the functional components of the total control unit 12050.

The drive system control unit 12010 controls the operations of the apparatuses for the vehicle drive system according to various programs. For example, the drive system control unit 12010 functions as a control apparatus for a driving force generation apparatus such as internal engine or drive motor for generating a driving force of the vehicle, a driving force transmission mechanism for transmitting a driving force to the wheels, a steering mechanism for adjusting the steering angle of the vehicle, a braking apparatus for generating a braking force of the vehicle, and the like.

The body system control unit 12020 controls the operations of various apparatuses equipped in the vehicle body according to various programs. For example, the body system control unit 12020 functions as a control apparatus for a keyless entry system, a smart key system, a power window apparatus, or various lights such as head lights, back lights, brake lights, directional signals, or fog lights. In this case, a radio wave originated from a portable machine as a key, or signals of various switches can be input to the body system control unit 12020. The body system control unit 12020 receives the input of the radio wave or signals, and controls the door lock apparatus, the power window apparatus, the lights, and the like of the vehicle.

The exterior information detection unit 12030 detects the information indicating the exterior of the vehicle mounting the vehicle control system 12000 thereon. For example, the exterior information detection unit 12030 is connected with a shooting part 12031. The exterior information detection unit 12030 causes the shooting part 12031 to shoot an image of the exterior of the vehicle, and receives the shot image. The exterior information detection unit 12030 may perform a processing of detecting an object such as person, vehicle, obstacle, road sign, or character on the road, or a distance detection processing on the basis of the received image.

The shooting part 12031 is a light sensor for receiving light and outputting an electric signal depending on the amount of received light. The shooting part 12031 can output the electric signal as an image, or can output it as distance measurement information. Further, light received by the shooting part 12031 may be a visible ray or a non-visible ray such as infrared ray.

The interior information detection unit 12040 detects the information indicating the interior of the vehicle. The interior information detection unit 12040 is connected with a driver's state detection part 12041 for detecting a driver's state, for example. The driver's state detection part 12041 includes a camera for shooting the driver, for example, and the interior information detection unit 12040 may calculate a degree of fatigue or a degree of concentration of the driver or may determine whether the driver is asleep at the wheel on the basis of the detection information input from the driver's state detection part 12041.

The microcomputer 12051 can calculate a control target value of the driving force generation apparatus, the steering mechanism, or the braking apparatus on the basis of the information indicating the exterior or interior of the vehicle obtained by the exterior information detection unit 12030 or the interior information detection unit 12040, and can output a control instruction to the drive system control unit 12010. For example, the microcomputer 12051 can perform cooperative control for realizing the advanced driver assistance system (ADAS) functions including collision avoidance or collision alleviation of the vehicle, follow-up traveling based on inter-vehicle distance, traveling at kept vehicle speed, collision alarm of the vehicle, lane deviation alarm of the vehicle, and the like.

Further, the microcomputer 12051 controls the driving force generation apparatus, the steering mechanism, the braking apparatus, or the like on the basis of the information indicating the surrounding of the vehicle obtained by the exterior information detection unit 12030 or the interior information detection unit 12040, thereby performing cooperative control for automatic driving of autonomous traveling irrespective of driver's operation, and the like.

Further, the microcomputer 12051 can output a control instruction to the body system control unit 12020 on the basis of the information indicating the exterior of the vehicle obtained by the exterior information detection unit 12030. For example, the microcomputer 12051 can control the head lights depending on the position of a leading vehicle or an oncoming vehicle detected by the exterior information detection unit 12030, and can perform cooperative control in order to achieve anti-glare such as switching from high beam to low beam.

The audio/image output part 12052 transmits an output signal of at least one of audio or image to an output apparatus capable of visually or aurally notifying information to the passengers in the vehicle or the outside of the vehicle. In the example of FIG. 21, an audio speaker 12061, a display part 12062, and an instrument panel 12063 are illustrated as output apparatuses by way of example. The display part 12062 may include at least one of an on-board display or a head-up display, for example.

Figure 22:
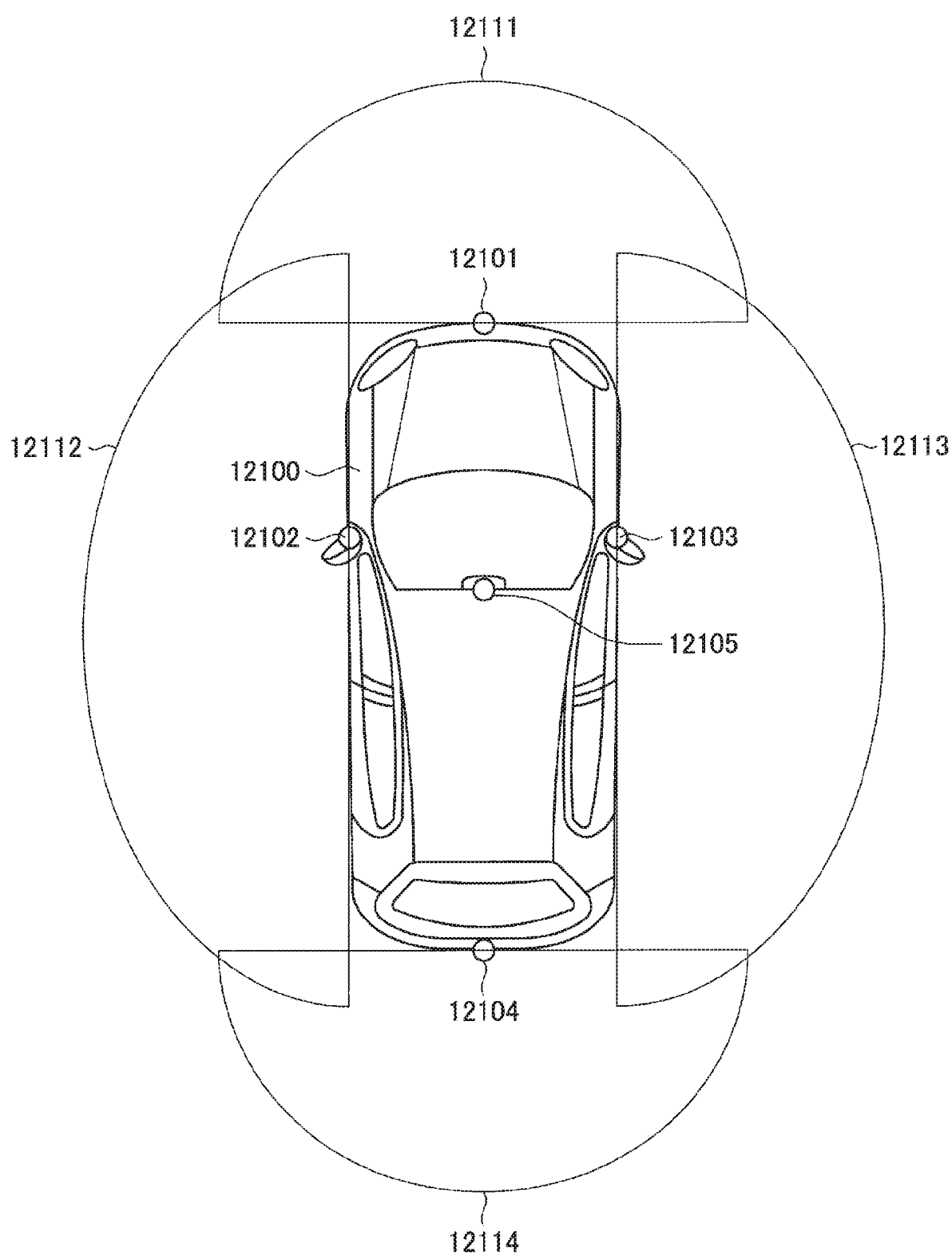
FIG. 22 is an explanatory diagram illustrating exemplary installation positions of an exterior information detection part and shooting parts.

FIG. 22 is a diagram illustrating exemplary installation positions of the shooting part 12031.

In FIG. 22, the vehicle 12100 has the shooting part 12031 including shooting parts 12101, 12102, 12103, 12104, and 12105.

The shooting parts 12101, 12102, 12103, 12104, and 12105 are provided at the front nose, the side mirrors, the rear bumper or back door, at the top part of the front shield inside the vehicle 12100, and the like, for example. The shooting part 12101 provided at the front nose and the shooting part 12105 provided at the top part of the front shield inside the vehicle mainly obtain images in front of the vehicle 12100. The shooting parts 12102 and 12103 provided at the side mirrors mainly obtain images on both sides of the vehicle 12100. The shooting part 12104 provided at the rear bumper or back door mainly obtains an image behind the vehicle 12100. The front images obtained by the shooting parts 12101 and 12105 are mainly used to detect a leading vehicle, a pedestrian, an obstacle, a traffic light, a road sign, a traffic lane, or the like.

Additionally, FIG. 22 illustrates exemplary shooting ranges of the shooting parts 12101 to 12104. A shooting range 12111 indicates a shooting range of the shooting part 12101 provided at the front nose, the shooting ranges 12112 and 12113 indicate the shooting ranges of the shooting parts 12102 and 12103 provided at the side mirrors, respectively, and a shooting range 12114 indicates a shooting range of the shooting part 12104 provided at the rear bumper or back door. For example, the image data shot by the shooting parts 12101 to 12104 are overlapped thereby to obtain a perspective image of the vehicle 12100 viewed from above.

At least one of the shooting parts 12101 to 12104 may have a function of obtaining distance information. For example, at least one of the shooting parts 12101 to 12104 may be a stereo camera configured of a plurality of imaging devices, or may be an imaging device having pixels for phase difference detection.

For example, the microcomputer 12051 finds a distance to each stereoscopic object in the shooting ranges 12111 to 12114 and a temporal change in the distance (relative speed to the vehicle 12100) on the basis of the distance information obtained from the shooting parts 12101 to 12104, thereby extracting, as a leading vehicle, a stereoscopic object traveling at a predetermined speed (0 km/h or more, for example) substantially in the same direction as the vehicle 12100, which is the closest stereoscopic object to the vehicle 12100 on the road. Further, the microcomputer 12051 can set an inter-vehicle distance to be previously secured behind the leading vehicle, and can perform automatic brake control (including follow-up stop control), automatic acceleration control (including follow-up start control), or the like. Cooperative control for automatic driving of autonomous traveling irrespective of driver's operation, and the like can be performed in this way.

For example, the microcomputer 12051 can classify and extract stereoscopic data regarding stereoscopic objects into two-wheel vehicle, standard-sized vehicle, large-sized vehicle, pedestrian, power pole, and the like on the basis of the distance information obtained from the shooting parts 12101 to 12104, and can use it for automatic obstacle avoidance. For example, the microcomputer 12051 discriminates the obstacles around the vehicle 12100 into obstacles capable of being visually confirmed by the driver of the vehicle 12100 and obstacles difficult to visually confirm. The microcomputer 12051 then determines a collision risk indicating a degree of risk of collision with each obstacle, and outputs an alarm to the driver via the audio speaker 12061 or the display part 12062 or performs forcible deceleration or avoidance steering via the drive system control unit 12010 when there is a collision possibility at a set value of collision risk, thereby performing driving support for collision avoidance.

At least one of the shooting parts 12101 to 12104 may be an infrared camera for detecting an infrared ray. For example, the microcomputer 12051 determines whether or not a pedestrian is present in the images shot by the shooting parts 12101 to 12104, thereby recognizing the pedestrian. The pedestrian is recognized in a procedure of extracting the characteristic points in the images shot by the shooting parts 12101 to 12104 as infrared cameras and a procedure of performing a pattern matching processing on a series of characteristic points indicating the contour of an object and determining whether or not the contour of the object is a pedestrian, for example. When the microcomputer 12051 determines that a pedestrian is present in the images shot by the shooting parts 12101 to 12104 and recognizes the pedestrian, the audio/image output part 12052 controls the display part 12062 to overlap a square contour line for emphasis on the recognized pedestrian for display. Further, the audio/image output part 12052 may control the display part 12062 to display an icon or the like indicating a pedestrian at a desired position.

An exemplary vehicle control system to which the technology according to the present disclosure can be applied has been described above. The technology according to the present disclosure can be applied to the shooting part 12031 among the above-described constituents. Specifically, the electronic component 10 in the camera module 1 according to each embodiment described above can be applied to the shooting part 12031. The technology according to the present disclosure is applied to the shooting part 12031 so that an easily-viewable shot image can be obtained and driver's fatigue can be reduced.

8. CONCLUSION

The preferred embodiments of the present disclosure have been described above in detail with reference to the accompanying drawings, but the technical scope of the present disclosure is not limited to the examples. It is clear that those skilled in the art in the technical field of the present disclosure can assume various changes or modifications within the scope of the technical spirit described in CLAIMS, and it is of course understood that the changes or modifications belong to the technical scope of the present disclosure.

Further, the effects described in the present specification are merely explanatory or exemplary, and are not restrictive. That is, the technology according to the present disclosure can obtain other effects clear to those skilled in the art from the description of the present specification together with the above effects or instead of the above effects.

Additionally, the following configurations also belong to the technical scope of the present disclosure.

(1)

An electronic component including:

a circuit board having a first face, a second face opposite to the first face, and a first opening;

a translucent member provide to oppose the first face of the circuit board;

an imaging device flip-chip mounted on the second face of the circuit board and having a light receiving face on a side opposing the translucent member; and a light absorption member provided between the circuit board and the translucent member and formed in a region other than the first opening in plan view on the first face of the circuit board.

(2)

The electronic component according to (1), in which the light absorption member has a second opening at a position corresponding to the first opening in plan view.

(3)

The electronic component according to (2), in which an opening peripheral end face of the second opening of the light absorption member is aligned with an opening peripheral end face of the first opening of the circuit board.

(4)

The electronic component according to (2), in which an opening peripheral end face of the second opening of the light absorption member is outside an opening peripheral end face of the first opening of the circuit board in plan view with respect to an arrangement of the imaging device.

(5)

The electronic component according to any one of (1) to (4), in which the light absorption member includes at least any of a member made of dye containing a black material, or a film containing a black material.

(6)

The electronic component according to (5), in which the black material includes a carbon material.

(7)

The electronic component according to any one of (1) to (6), in which the light absorption member includes adhesive resin for fixing the circuit board and the translucent member.

(8)

The electronic component according to any one of (1) to (7), in which the translucent member has an outer peripheral end face, and the electronic component further includes a light shielding member formed at least on the outer peripheral end face of the translucent member.

(9)

An electronic component including:

a circuit board having a first face, a second face opposite to the first face, and an opening;

a translucent member provided to oppose the first face of the circuit board and having an outer peripheral end face;

an imaging device flip-chip mounted on the second face of the circuit board and having a light receiving face on a side opposing the translucent member; and a light shielding member formed at least on the outer peripheral end face of the translucent member.

(10)

The electronic component according to (8) or (9), further including:

encapsulation resin provided between the circuit board and the imaging device, and sealing between the circuit board and the imaging device and fixing the circuit board and the imaging device, in which the light shielding member is further formed on an outer surface of the encapsulation resin.

(11)

The electronic component according to any one of (8) to (10), in which the light shielding member is further formed on at least any of the first face or the second face of the circuit board outside the translucent member in plan view.

(12)

The electronic component according to (11), in which the light shielding member is formed on both the first face and the second face.

(13)

The electronic component according to any one of (8) to (12), in which the light shielding member is further formed on a face opposite to the light receiving face of the imaging device.

(14)

The electronic component according to any one of (8) to (13), in which the light shielding member is formed in at least part of a region other than the opening of the circuit board in plan view on a face of the translucent member opposite to a side where the imaging device is provided.

(15)

The electronic component according to any one of (8) to (14), in which the light shielding member is made of a metal film.

(16)

A camera module including:

a circuit board having a first face, a second face opposite to the first face, and an opening;

a translucent member provided to oppose the first face of the circuit board;

a lens unit provided opposite to a side of the translucent member opposing the circuit board;

an imaging device flip-chip mounted on the second face of the circuit board and having a light receiving face on a side opposing the translucent member; and a light absorption member provided between the circuit board and the translucent member and formed in a region other than the first opening in plan view on the first face of the circuit board.

(17)

A camera module including:

a circuit board having a first face, a second face opposite to the first face, and an opening;

a translucent member provided to oppose the first face of the circuit board and having an outer peripheral end face;

a lens unit provided opposite to a side of the translucent member opposing the circuit board;

an imaging device flip-chip mounted on the second face of the circuit board and having a light receiving face on a side opposing the translucent member; and a light shielding member formed at least on the outer peripheral end face of the translucent member.

(18)

A method for manufacturing an electronic component including:

forming a light absorption member on a first face of a circuit board having the first face and a second face opposite to the first face;

forming an opening on the circuit board with the light absorption member formed;

flip-chip mounting an imaging device having a light receiving face on the second face of the circuit board while the light receiving face opposes the opening of the circuit board; and providing a translucent member to oppose the first face of the circuit board and to sandwich the light absorption member between the translucent member and the circuit board.

(19)

A method for manufacturing an electronic component including:

forming a light absorption member other than in an opening on a first face of a circuit board having the first face, a second face opposite to the first face, and the opening in plan view;

flip-chip mounting an imaging device having a light receiving face on the second face of the circuit board while the light receiving face opposes the opening of the circuit board; and providing a translucent member to oppose the first face of the circuit board and to sandwich the light absorption member between the translucent member and the circuit board.

REFERENCE SIGNS LIST

1 Camera module
2 Lens unit
3 Group of lenses
4 Holder
5 Housing
10, 100, 110 Electronic component
11 Circuit board
12 Wiring
13 Imaging device
14 Translucent member
15 Light absorption member
16 Encapsulation resin
17 Passive component
18 Reinforcement plate
19 Bump
20 Light shielding member

The invention claimed is:

1. An electronic component, comprising:
a circuit board having a first face, a second face opposite to the first face, and a first opening;
a light transmitting member on the first face of the circuit board;
an imaging device flip-chip mounted on the second face of the circuit board, wherein the imaging device comprises a light receiving face on a side opposing the light transmitting member;
a light absorption member between the circuit board and the light transmitting member, wherein the light absorption member is in a region other than the first opening in plan view on the first face of the circuit board; and
a light shielding member on at least one the first face or the second face of the circuit board outside the light transmitting member in the plan view, wherein the light shielding member is made of a metal film.

2. The electronic component according to claim 1, wherein the light absorption member has a second opening at a position corresponding to the first opening of the circuit board.

3. The electronic component according to claim 2, wherein an opening peripheral end face of the second opening of the light absorption member is aligned with an opening peripheral end face of the first opening of the circuit board.

4. The electronic component according to claim 2, wherein an opening peripheral end face of the second opening of the light absorption member is outside an opening peripheral end face of the first opening of the circuit board in the plan view with respect to an arrangement of the imaging device.

5. The electronic component according to claim 1, wherein the light absorption member comprises at least one of a member made of dye that contains a black material, or a film that contains a black material.

6. The electronic component according to claim 5, wherein the black material comprises a carbon material.

7. The electronic component according to claim 1, wherein the light absorption member comprises adhesive resin to fix the circuit board and the light transmitting member.

8. The electronic component according to claim 1, wherein
the light transmitting member has an outer peripheral end face, and
the light shielding member is at least on the outer peripheral end face of the light transmitting member.

9. An electronic component, comprising:
a circuit board having a first face, a second face opposite to the first face, and an opening;
a light transmitting member on the first face of the circuit board, wherein the light transmitting member has an outer peripheral end face;
an imaging device flip-chip mounted on the second face of the circuit board, wherein the imaging device comprises a light receiving face on a side opposing the light transmitting member; and
a light shielding member at least on the outer peripheral end face of the light transmitting member, wherein the light shielding member is made of a metal film.

10. The electronic component according to claim 9, further comprising
an encapsulation resin between the circuit board and the imaging device, wherein
the encapsulation resin configured to seal the circuit board and the imaging device, and
the light shielding member is on an outer surface of the encapsulation resin.

11. The electronic component according to claim 9, wherein the light shielding member is on at least one of the first face or the second face of the circuit board outside the light transmitting member in plan view.

12. The electronic component according to claim 11, wherein the light shielding member is on both the first face and the second face.

13. The electronic component according to claim 9, wherein the light shielding member is on a face opposite to the light receiving face of the imaging device.

14. The electronic component according to claim 9, wherein the light shielding member is in at least part of a region other than the opening of the circuit board in plan view on a face of the light transmitting member opposite to a side where the imaging device is provided.

15. A camera module, comprising:
a circuit board having a first face, a second face opposite to the first face, and an opening;
a light transmitting member on the first face of the circuit board;
a lens unit opposite to a side of the light transmitting member opposing the circuit board;
an imaging device flip-chip mounted on the second face of the circuit board, wherein the imaging device comprises a light receiving face on a side opposing the light transmitting member;
a light absorption member between the circuit board and the light transmitting member, wherein the light absorption member is in a region other than the opening in plan view on the first face of the circuit board; and
a light shielding member on at least one the first face or the second face of the circuit board outside the light transmitting member in the plan view, wherein the light shielding member is made of a metal film.

16. A camera module, comprising:
a circuit board having a first face, a second face opposite to the first face, and an opening;
a light transmitting member on the first face of the circuit board, wherein the light transmitting member has an outer peripheral end face;

a lens unit opposite to a side of the light transmitting member opposing the circuit board;

an imaging device flip-chip mounted on the second face of the circuit board, wherein the imaging device comprises a light receiving face on a side opposing the light transmitting member; and a light shielding member at least on the outer peripheral end face of the light transmitting member, wherein the light shielding member is made of a metal film.

17. A method for manufacturing an electronic component, comprising:

forming a light absorption member on a first face of a circuit board, wherein the circuit board has the first face and a second face opposite to the first face;

forming an opening on the circuit board with the light absorption member formed;

flip-chip mounting an imaging device having a light receiving face on the second face of the circuit board, wherein the light receiving face opposes the opening of the circuit board;

providing a light transmitting member to oppose the first face of the circuit board, wherein the light absorption member is between the light transmitting member and the circuit board; and forming a light shielding member on at least one the first face or the second face of the circuit board outside the light transmitting member in plan view, wherein the light shielding member is made of a metal film.

18. A method for manufacturing an electronic component, comprising:

forming a light absorption member in a region other than in an opening on a first face of a circuit board, wherein the circuit board has the first face, a second face opposite to the first face, and the opening in plan view;

flip-chip mounting an imaging device having a light receiving face on the second face of the circuit board, wherein the light receiving face opposes the opening of the circuit board;

providing a light transmitting member to oppose the first face of the circuit board, wherein the light absorption member is between the light transmitting member and the circuit board; and forming a light shielding member on at least one the first face or the second face of the circuit board outside the light transmitting member in the plan view, wherein the light shielding member is made of a metal film.

* * * * *